US010979068B1

(12) United States Patent
Tseng et al.

(10) Patent No.: US 10,979,068 B1
(45) Date of Patent: Apr. 13, 2021

(54) DIGITAL-TO-ANALOG CONVERTER

(71) Applicant: QUALCOMM INCORPORATED, San Diego, CA (US)

(72) Inventors: Yi-Hung Tseng, San Diego, CA (US); Karthik Nagarajan, Cupertino, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/577,074

(22) Filed: Sep. 20, 2019

(51) Int. Cl.
*H03M 1/66* (2006.01)
*H04B 1/40* (2015.01)
*H03L 7/099* (2006.01)
*H03L 7/093* (2006.01)

(52) U.S. Cl.
CPC .............. *H03M 1/66* (2013.01); *H03L 7/093* (2013.01); *H03L 7/099* (2013.01); *H04B 1/40* (2013.01)

(58) Field of Classification Search
CPC ..................................................... H03M 1/66
USPC ......................................................... 327/156
See application file for complete search history.

(56) References Cited

U.S. PATENT DOCUMENTS

| | | | |
|---|---|---|---|
| 7,358,885 B2 | 4/2008 | Maxim et al. | |
| 7,433,656 B2 | 10/2008 | Kappes et al. | |
| 7,729,300 B1 * | 6/2010 | Ziazadeh | H03M 1/0881 341/144 |
| 8,547,140 B1 | 10/2013 | Faucher et al. | |
| 8,816,786 B2 | 8/2014 | Tham | |
| 8,868,017 B2 | 10/2014 | Kang et al. | |
| 9,252,791 B1 | 2/2016 | Sinha et al. | |
| 2011/0316639 A1 | 12/2011 | Fischette | |

OTHER PUBLICATIONS

Han T., et al., "A 2.7-GHz Digitally-controlled Ring Oscillator with Supply Sensitivity of 0.0014%-f DCO/1%-VDD Using Digital Current-regulated Tuning," Circuits and Systems (ISCAS), 2013 IEEE International Symposium on, IEEE, May 19, 2013 (May 19, 2013), pp. 2690-2693, XP032446504, DOI: 10.1109/ISCAS.2013.6572433 ISBN: 978-1-4673-5760-9 paragraph [Abstract] -paragraph [00IV]; figures 1-8.
International Search Report and Written Opinion—PCT/US2020/048343—ISA/EPO—dated Nov. 30, 2020.
Xing C., et al., "Analysis and Design of an Ultra-Low-Power Bluetooth Low-Energy Transmitter With Ring Oscillator-Based ADPLL and 4x Frequency Edge Combiner," IEEE Journal of Solid-State Circuits, IEEE, USA, vol. 54, No. 5, May 1, 2019 (May 1, 2019), pp. 1339-1350, XP011721037, ISSN: 0018-9200, DOI: 10.1109/JSSC.2019.2896404 [retrieved on Apr. 22, 2019] paragraph [Abstract] -paragraph [00VI]; figures 1-17.

* cited by examiner

*Primary Examiner* — Tomi Skibinski
(74) *Attorney, Agent, or Firm* — Smith Tempel Blaha LLC/Qualcomm

(57) ABSTRACT

A digital to analog converter (DAC) includes a plurality of DAC transistor devices having an input side configured to be selectively coupled to a system voltage based on a digital input signal and an output side configured to provide an analog output signal, a plurality of non-DAC transistor devices coupled to the input side of the DAC transistor devices, the non-DAC transistor devices configured as variable resistances, and a control circuit configured to adjust a bias of the non-DAC transistor devices.

28 Claims, 13 Drawing Sheets

DIGITAL-TO-ANALOG CONVERTER

FIELD

The present disclosure relates generally to electronics, and more specifically to digital to analog converters.

BACKGROUND

Wireless communication devices and technologies are becoming ever more prevalent. Wireless communication devices generally transmit and receive communication signals. A communication signal is typically processed by a variety of different components and circuits. One of the circuits that process a communication signal is a phase locked loop (PLL). A PLL is a device that compares the phase and/or frequency of two different signals and generates an error signal that represents the phase and/or frequency difference between the two compared signals. When the two signals have different phase and/or frequencies, the phase and/or frequency difference between the two signals is constantly varying. The error signal is then used to control the phase and/or frequency of the loop, such that when the phase and/or frequency difference between the two signals is fixed, the two signals are at the same phase and/or frequency. A digital PLL (DPLL) typically includes a phase detector, and/or a frequency comparator or detector, a digitally controlled oscillator (DCO) that can adjust the frequency of the PLL based on a control voltage or current signal, a filter circuit, a feedback circuit, and may include other circuits, such as a buffer circuit, etc. The DCO may include a digital-to-analog converter (DAC) and an oscillator.

The term "5G" refers to an evolving generation of wireless communication technology. One evolving technology is the ability to communicate over higher frequencies than LTE, such as at millimeter-wave (mmw) frequencies. For example, mmw signals are those that operate at extremely high frequencies, such as 20-30 Gigahertz (GHz) and beyond. A PLL designed to operate at mmw frequencies may be required to meet stringent design and/or performance specifications. A DCO included in the PLL similarly may have stringent design and/or performance specifications. It is desirable to provide a DAC with good performance.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides a digital to analog converter (DAC) including a plurality of DAC transistor devices having an input side configured to be selectively coupled to a system voltage based on a digital input signal and an output side configured to provide an analog output signal, a plurality of non-DAC transistor devices coupled to the input side of the DAC transistor devices, the non-DAC transistor devices configured as variable resistances, and a control circuit configured to adjust a bias of the non-DAC transistor devices.

Another aspect of the disclosure provides a method for operating a digital-to-analog converter (DAC) including providing a variable resistance at an input side of a digital to analog converter (DAC), providing a signal indicative of a voltage headroom to a control circuit, and adjusting the variable resistance using the control circuit.

Another aspect of the disclosure provides a device including means for providing a variable resistance at an input side of a digital to analog converter (DAC), means for providing a signal indicative of a voltage headroom, and means for adjusting the variable resistance based on the signal indicative of the voltage headroom.

Another aspect of the disclosure provides a phase locked loop (PLL) circuit including a phase detector configured to provide a control signal, a filter configured to receive the control signal and provide a filtered voltage signal, and a digitally controlled oscillator (DCO) configured to receive the filtered voltage signal, the DCO having a digital-to-analog converter (DAC) circuit, and a ring oscillator. The DAC circuit includes a plurality of DAC transistor devices having an input side coupled to an output of the filter and an output side coupled to the ring oscillator, and a plurality of non-DAC transistor devices coupled to the input side of the DAC transistor devices, the non-DAC transistor devices configured as variable resistances.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

DETAILED DESCRIPTION

Figure 1:
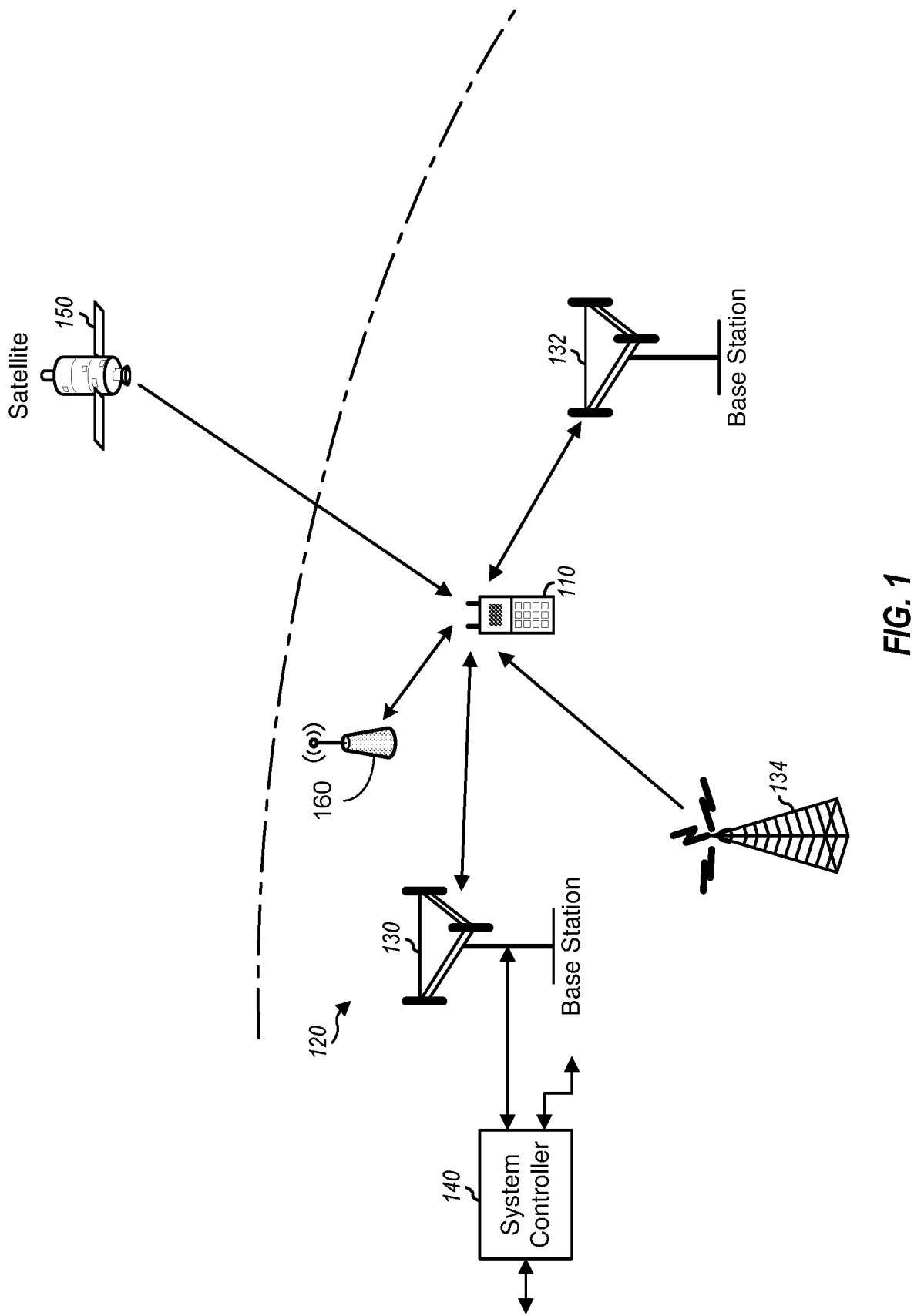
FIG. 1 is a diagram showing a wireless device communicating with a wireless communication system.

The word "exemplary" is used herein to mean "serving as an example, instance, or illustration." Any aspect described herein as "exemplary" is not necessarily to be construed as preferred or advantageous over other aspects.

A PLL designed to operate at mmw frequencies should meet very stringent integrated phase noise (IPN) specifications, which may include a stringent 1/f noise specification for the DCO and the capability of having a wide frequency tuning range. A wide tuning range PLL may have a tuning range of, for example, 600 MHz to 4.5 GHz, so having a DAC with a wide current output range is also beneficial to support the wide frequency tuning range of the PLL.

The DAC may be implemented using, for example, metal oxide semiconductor (MOS) technology, and can be P-type (PMOS) or N-type (NMOS) or a combination of PMOS and NMOS. When implemented using PMOS technology, the DAC may contribute a significant amount of phase noise at the output of the PLL, with the dominant type of noise at low offset frequencies from the PMOS DAC being referred to as "flicker noise" or "1/f noise." A low offset frequency is one that has a small frequency offset from the carrier frequency, or operating frequency, of the DAC. Flicker noise is a type of electronic noise having a "1/f" power spectral density. The term "1/f noise" may be defined as a signal or process with a frequency spectrum such that the power spectral density (energy or power per frequency interval) is inversely proportional to the frequency of the signal. This noise is generally higher at lower offset frequencies and is difficult to filter out. Therefore, a DAC having a wide current range and low flicker noise may be beneficial. Making the DAC larger by increasing the width and length of the transistors that comprise the DAC may reduce the flicker noise. However, increasing the width and length of the entire DAC may entail a costly tradeoff in a wide tuning range PLL because typically the DAC occupies a significant area in order to provide a wide range output current. Further, increasing such already large DAC may lead to an undesirably large required area and increased power consumption.

Exemplary embodiments of the disclosure are directed to a DAC circuit. The DAC circuit may implement active degeneration, for example that may reduce low frequency 1/f noise in the DAC. In an exemplary embodiment, a non-DAC transistor device may be implemented at an input side of a DAC transistor device. The non-DAC transistor device may be implemented so as to create a variable resistance at the input side of the DAC transistor device. The non-DAC transistor device may be configured to provide an adjustable degenerative resistance to the DAC transistor device. The resistance of the non-DAC transistor device may be controlled by a control circuit that may receive a feedback signal from an operating condition circuit. The operating condition circuit may be responsive to one or more of a system voltage level of the DAC and a current output of the DAC.

Embodiments are described herein of a DAC implemented in a PLL and/or a DCO, for example in a wireless device. Further, a DAC for use with certain frequency ranges is described in some aspects. Those of skill in the art will appreciate, however, that the teachings herein may be utilized with a DAC that may be implemented in combination with any number of devices or uses, including uses other than in a PLL and DCO and in devices other than a wireless device, and/or with any number of different frequency ranges.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, a 5G system, or some other wireless system. A CDMA system may implement Wideband CDMA (WCDMA), CDMA 1×, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a medical device, a device configured to connect to one or more other devices (for example through the internet of things), a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1×, EVDO, TD-SCDMA, GSM, 802.11, 5G, etc.

Wireless device 110 may support carrier aggregation, for example as described in one or more LTE or 5G standards. In some embodiments, a single stream of data is transmitted over multiple carriers using carrier aggregation, for example as opposed to separate carriers being used for respective data streams.

Wireless device 110 may be able to operate in low-band (LB) covering frequencies lower than 1000 megahertz (MHz), mid-band (MB) covering frequencies from 1000 MHz to 2300 MHz, and/or high-band (HB) covering frequencies higher than 2300 MHz. For example, low-band may cover 698 to 960 MHz, mid-band may cover 1475 to 2170 MHz, and high-band may cover 2300 to 2690 MHz and 3400 to 3800 MHz. Low-band, mid-band, and high-band refer to three groups of bands (or band groups), with each band group including a number of frequency bands (or simply, "bands"). Each band may cover up to 200 MHz and may include one or more carriers. Each carrier may cover up to 20 MHz in LTE. LTE Release 11 supports 35 bands, which are referred to as LTE/UMTS bands and are listed in 3GPP TS 36.101. Wireless device 110 may be configured with up to five carriers in one or two bands in LTE Release 11. Wireless device 110 may further be able to operate at frequencies higher than 3800 MHz, for example at frequencies up to 6 GHz and/or at mmw frequencies.

The wireless device 110 may also be in communication with a wireless device 160. In an exemplary embodiment, the wireless device 160 may be a wireless access point, or another wireless communication device that comprises, or comprises part of a wireless local area network (WLAN). An exemplary embodiment of a WLAN signal may include WiFi, or other communication signals that use unlicensed communication spectrum in the range of, for example, 5 GHz to 6 GHz.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2:
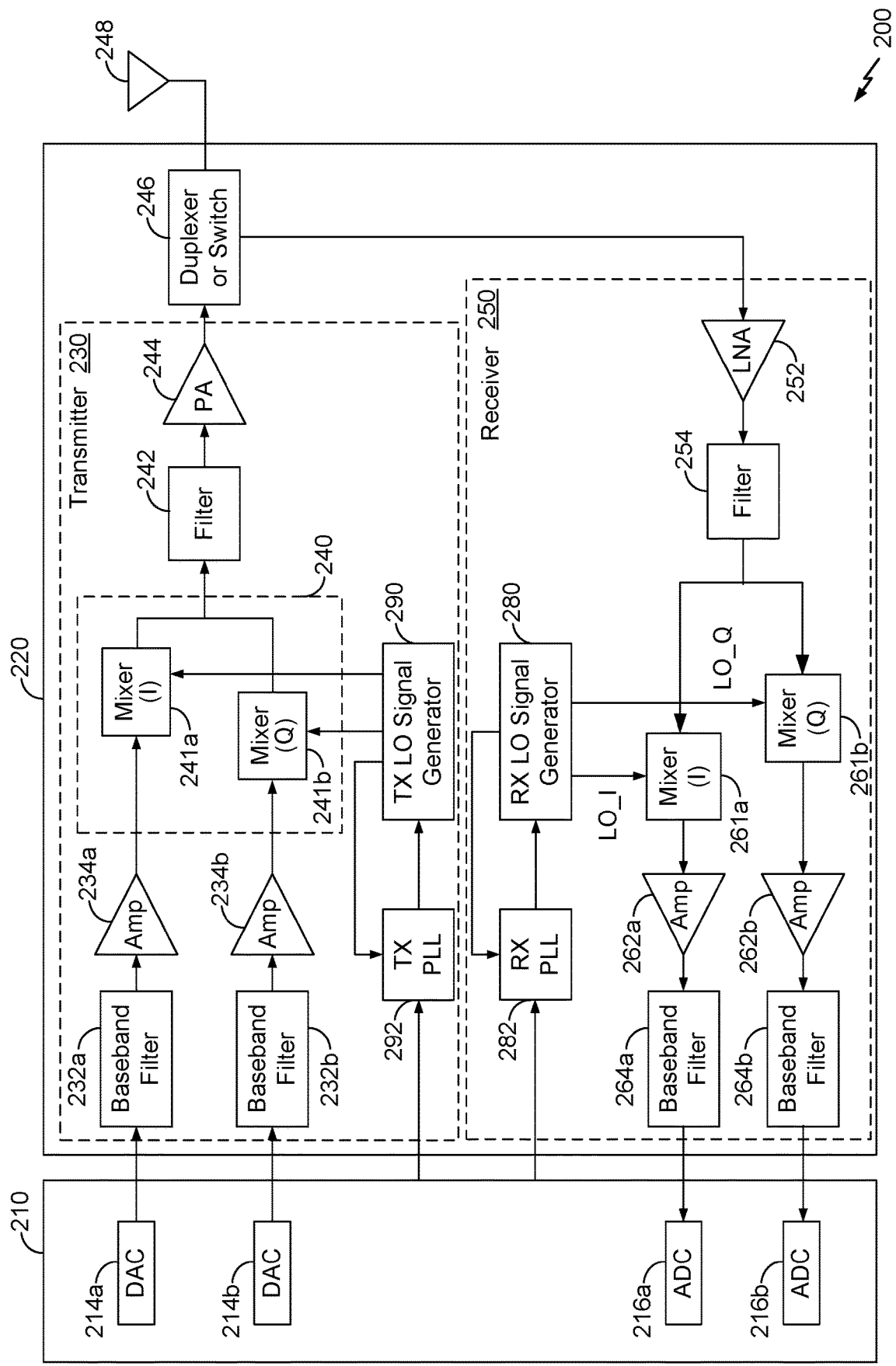
FIG. 2 is a block diagram showing a wireless device in which exemplary techniques of the present disclosure may be implemented.

FIG. 2 is a block diagram showing a wireless device 200 in which the exemplary techniques of the present disclosure may be implemented. FIG. 2 shows an example of a transceiver 220. In general, the conditioning of the signals in a transmitter 230 and a receiver 250 may be performed by one or more stages of amplifier, filter, upconverter, downconverter, etc. These circuit blocks may be arranged differently from the configuration shown in FIG. 2. Furthermore, other circuit blocks not shown in FIG. 2 may also be used to condition the signals in the transmitter 230 and receiver 250. Unless otherwise noted, any signal in FIG. 2, or any other figure in the drawings, may be either single-ended or differential. Some circuit blocks in FIG. 2 may also be omitted.

In the example shown in FIG. 2, wireless device 200 generally comprises a transceiver 220 and a data processor 210. The data processor 210 may include a memory (not shown) to store data and program codes, and may generally comprise analog and digital processing elements, or may comprise only digital processing elements. The transceiver 220 includes a transmitter 230 and a receiver 250 that support bi-directional communication. In general, wireless device 200 may include any number of transmitters and/or receivers for any number of communication systems and frequency bands. All or a portion of the transceiver 220 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband, or near baseband, in one stage. The super-heterodyne and direct-conversion architectures may use different circuit blocks and/or have different requirements. In the example shown in FIG. 2, transmitter 230 and receiver 250 are implemented with the direct-conversion architecture.

In the transmit path, the data processor 210 processes data to be transmitted and provides in-phase (I) and quadrature (Q) analog output signals to the transmitter 230. In an exemplary embodiment, the data processor 210 includes digital-to-analog-converters (DAC's) 214a and 214b for converting digital signals generated by the data processor 210 into the I and Q analog output signals, e.g., I and Q output currents, for further processing. In other embodiments, the DACs 214a and 214b are included in the transceiver 220 and the data processor 210 provides data (e.g., for I and Q) to the transceiver 220 digitally.

Within the transmitter 230, lowpass filters 232a and 232b filter the I and Q analog transmit signals, respectively, to remove undesired images caused by the prior digital-to-analog conversion Amplifiers (Amp) 234a and 234b amplify the signals from lowpass filters 232a and 232b, respectively, and provide I and Q baseband signals. An upconverter 240 upconverts the I and Q baseband signals with I and Q transmit (TX) local oscillator (LO) signals from a TX LO signal generator 290 and provides an upconverted signal. A filter 242 filters the upconverted signal to remove undesired images caused by the frequency upconversion as well as noise in a receive frequency band. A power amplifier (PA) 244 amplifies the signal from filter 242 to obtain the desired output power level and provides a transmit RF signal. The transmit RF signal is routed through a duplexer or switch 246 and transmitted via an antenna 248.

The power amplifier 244 may comprise one or more stages comprising, for example, driver stages, power amplifier stages, or other components, that can be configured to amplify a communication signal on one or more frequencies, in one or more frequency bands, and at one or more power levels. Depending on various factors, the power amplifier 244 can be configured to operate using one or more bias signals and can be configured in various topologies or architectures.

In the receive path, antenna 248 receives communication signals and provides a received RF signal, which is routed through duplexer or switch 346 and provided to a low noise amplifier (LNA) 252. The duplexer 246 is designed to operate with a specific RX-to-TX duplexer frequency separation, such that RX signals are isolated from TX signals. The received RF signal is amplified by LNA 252 and filtered by a filter 254 to obtain a desired RF input signal. Down-conversion mixers 261a and 261b mix the output of filter 254 with I and Q receive (RX) LO signals (i.e., LO_I and LO_Q) from an RX LO signal generator 280 to generate I and Q baseband signals. The I and Q baseband signals are amplified by amplifiers 262a and 262b and further filtered by lowpass filters 264a and 264b to obtain I and Q analog input signals, which are provided to data processor 210. In the exemplary embodiment shown, the data processor 210 includes analog-to-digital-converters (ADC's) 216a and 216b for converting the analog input signals into digital signals to be further processed by the data processor 210. In some embodiments, the ADCs 216a and 216b are included in the transceiver 220 and provide data to the data processor 210 digitally.

In FIG. 2, TX LO signal generator 290 generates the I and Q TX LO signals used for frequency upconversion, while RX LO signal generator 280 generates the I and Q RX LO signals used for frequency downconversion. Each LO signal is a periodic signal with a particular fundamental frequency. A phase locked loop (PLL) 292 receives timing information from data processor 210 and generates a control signal used to adjust the frequency and/or phase of the TX LO signals from LO signal generator 290. Similarly, a PLL 282 receives timing information from data processor 210 and generates a control signal used to adjust the frequency and/or phase of the RX LO signals from LO signal generator 280.

Wireless device 200 may support CA and may (i) receive multiple downlink signals transmitted by one or more cells on multiple downlink carriers at different frequencies and/or (ii) transmit multiple uplink signals to one or more cells on multiple uplink carriers. Those of skill in the art will understand, however, that aspects described herein may be implemented in systems, devices, and/or architectures that do not support carrier aggregation.

Certain elements of the transceiver 220 are functionally illustrated in FIG. 2, and the configuration illustrated therein may or may not be representative of a physical device configuration in certain implementations. For example, as described above, transceiver 220 may be implemented in various integrated circuits (ICs), RF ICs (RFICs), mixed-signal ICs, etc. In some embodiments, the transceiver 220 is implemented on a substrate or board such as a printed circuit board (PCB) having various modules. For example, the PA 244, the filter 242, and the duplexer 246 may be implemented in separate modules or as discrete components, while the remaining elements illustrated in the transceiver 220 may be implemented in a single transceiver chip. Further, while FIG. 2 illustrates I and Q signals, those of skill in the art will understand that the transceiver 220 may alternatively be implemented using a polar architecture or may include elements to implement a polar architecture in addition to a quadrature architecture.

Exemplary embodiments of the disclosure are directed to a DAC, which may include active degeneration and may be implemented in a digitally controlled oscillator (DCO), which may be part of, or implemented with or within, the RX PLL 282 and/or the TX PLL 292, or other components.

Figure 3:
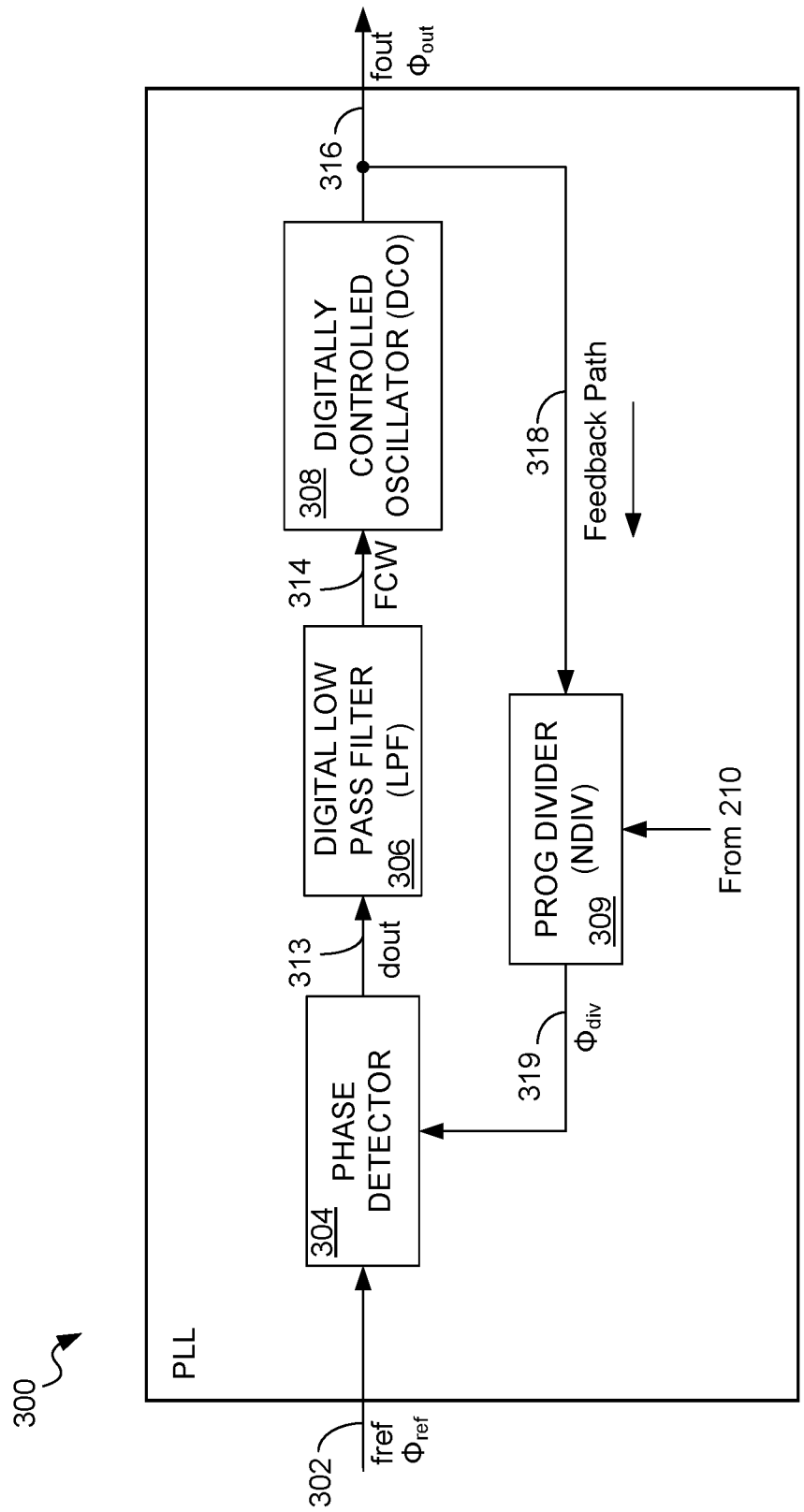
FIG. 3 is a simplified block diagram of a PLL circuit.

FIG. 3 is a simplified block diagram of a PLL circuit 300. The PLL circuit 300 may be an example of the RX PLL 282 or the TX PLL 292 described herein. In an exemplary embodiment, the PLL circuit 300 is an example of a digital PLL (DPLL). However, it is to be understood that the embodiments described herein can be applied to an analog PLL as well, and to PLL circuits other than the PLL circuits of FIG. 2. For simplicity, the term PLL is used in this document throughout to refer to either an analog PLL or a digital PLL. In an exemplary embodiment, the PLL circuit 300 includes a phase detector (PD) 304, a filter 306, a digitally controlled oscillator (DCO) 308, and a feedback circuit, which may comprise a programmable 1/N divider (NDIV) 309. In an exemplary embodiment, the filter 306 may be a digital low pass filter (LPF), and may also be referred to as a loop filter.

An input signal at a reference frequency, fref, with an input phase, $\phi_{ref}$, is provided over connection 302 to the phase detector 304. In an exemplary embodiment, the phase detector 304 may comprise a phase comparator, or other circuitry, which compares the phase of the input signal on connection 302 with a feedback signal ($\phi_{div}$) on connection 319 based on an output signal having a frequency, fout, and an output phase, $\phi_{out}$, after processing by the programmable divider 309. The phase detector 304 compares the phase of the signals on connections 302 and 319 and generates a digitized output, dout, on connection 313 based on the phase difference between the phase of the signal on connection 302 and the phase of the feedback signal on connection 319. The output of the phase detector, dout, on connection 313 is then low pass filtered by the digital low pass filter 306. In an exemplary embodiment, the filter 306 removes high frequency noise from the signal, dout, on connection 313, and provides one or more DAC codes contained in a frequency code word (FCW) on connection 314.

The DAC code in the FCW on connection 314 is then provided to the DCO 308, which provides the output signal of the DCO 308 having frequency fout and output phase $\phi_{out}$. The frequency and phase of the output signal (fout and $\phi_{out}$) of the DCO 308 is directly proportional to the frequency and phase of the input signal (fref and $\phi_{ref}$). The input phase, $\phi_{ref}$, of fref and output phase, $\phi_{out}$, of fout, are compared and adjusted through the feedback path 318 until the output phase, $\phi_{out}$, equals the input phase, $\phi_{ref}$. The programmable divider 309 may be programmable by, for example, the data processor 210 of FIG. 2, to provide a divide-by-n function (NDIV). The PLL circuit 300 operates in three stages, these being free-running, capture, and phase lock.

In an exemplary embodiment, the phase detector 304 may be a phase comparator circuit that compares the input phase, $\phi_{ref}$, and the phase of the divided DCO clock at connection 319 ($\phi_{div}$), and produces the digitized output, dout, which is proportional to the phase difference between the input phase, $\phi_{ref}$, and phase of the divided DCO clock, $\phi_{div}$.

In an exemplary embodiment, the filter 306 attenuates high frequency noise in the output of the phase detector 304, thus helping to control the dynamic characteristics of the PLL circuit 300. The dynamic characteristics include capture and lock ranges, bandwidth, and transient response. The lock range is the tracking range where the range of frequencies of the PLL circuit 300 follows the changes in the input frequency and phase. The capture range is the range in which the PLL circuit 300 attains the phase lock. When the feedback loop through the programmable divider 309 locks, the DCO 308 generates an output frequency, fout, such that fout=NDIV*fref.

Figure 4:
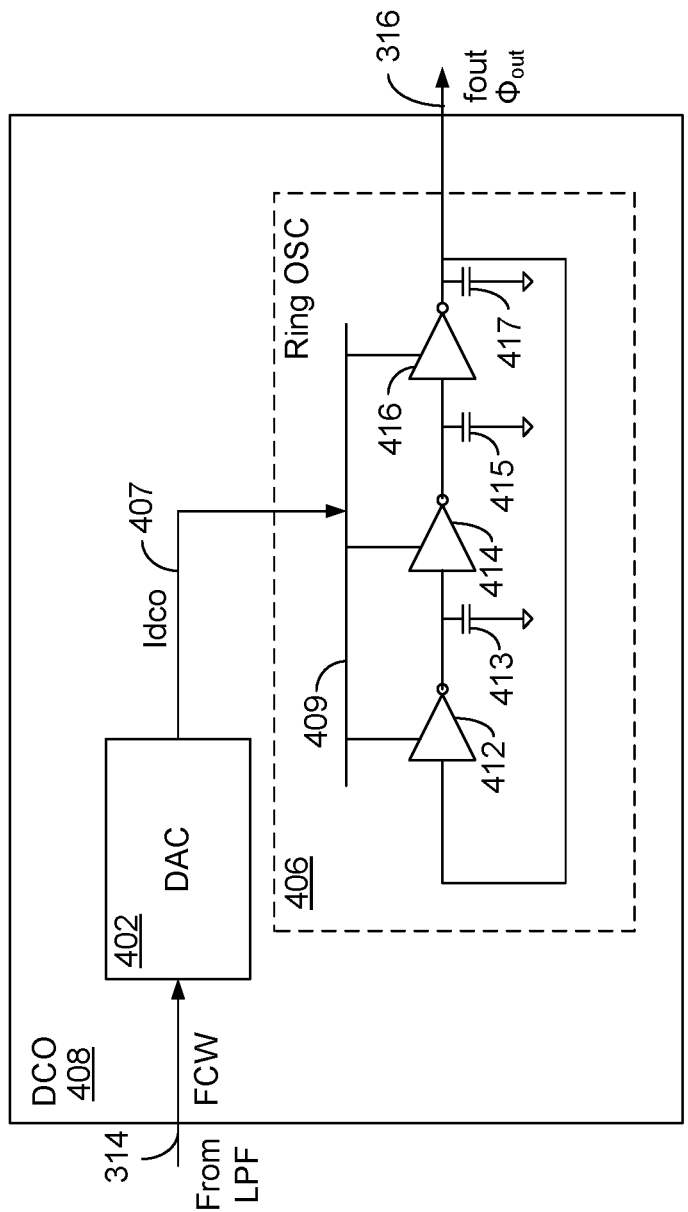
FIG. 4 is a schematic diagram showing an exemplary embodiment of the DCO of FIG. 3 in greater detail.

FIG. 4 is a schematic diagram showing an exemplary embodiment 408 of the DCO of FIG. 3 in greater detail. In an exemplary embodiment, the DCO 408 comprises a digital-to-analog converter (DAC) 402 and a ring oscillator 406. The output of the digital low pass filter 306 (FIG. 3) is provided to the DAC 402 over connection 314 (FIG. 3). The DAC 402 generates a current, referred to as Idco, which is provided to the ring oscillator 406 over connection 407. The output, fout, of the ring oscillator 406 on connection 316, is responsive to the current signal, Idco, on connection 407.

The ring oscillator 406 comprises an odd number of inverters configured in a ring, the output of which oscillates between two voltage levels, representing logic values true and false. The inverters are configured in a chain and the output of the last inverter is fed back into the first inverter. In an exemplary embodiment, the ring oscillator 406 comprises inverters 412, 414, and 416, and capacitors 413, 415, and 417. The capacitors 413, 415, and 417 may be referred to as load capacitors, and represent the effective capacitive load, $C_{load}$ at the output of each respective inverter stage 412, 414, and 416. The current, Idco, is provided to each inverter over a bus 409. The output, fout ($\phi_{out}$), is taken from the inverter 416 over connection 316 (FIG. 3), and is controlled by the current, Idco, on connection 407. Although three inverter stages 412, 414, and 416; and three capacitors 413, 415, and 417 are shown in FIG. 4, the ring oscillator 406 may comprise more inverter stages and capacitors.

Figure 5:
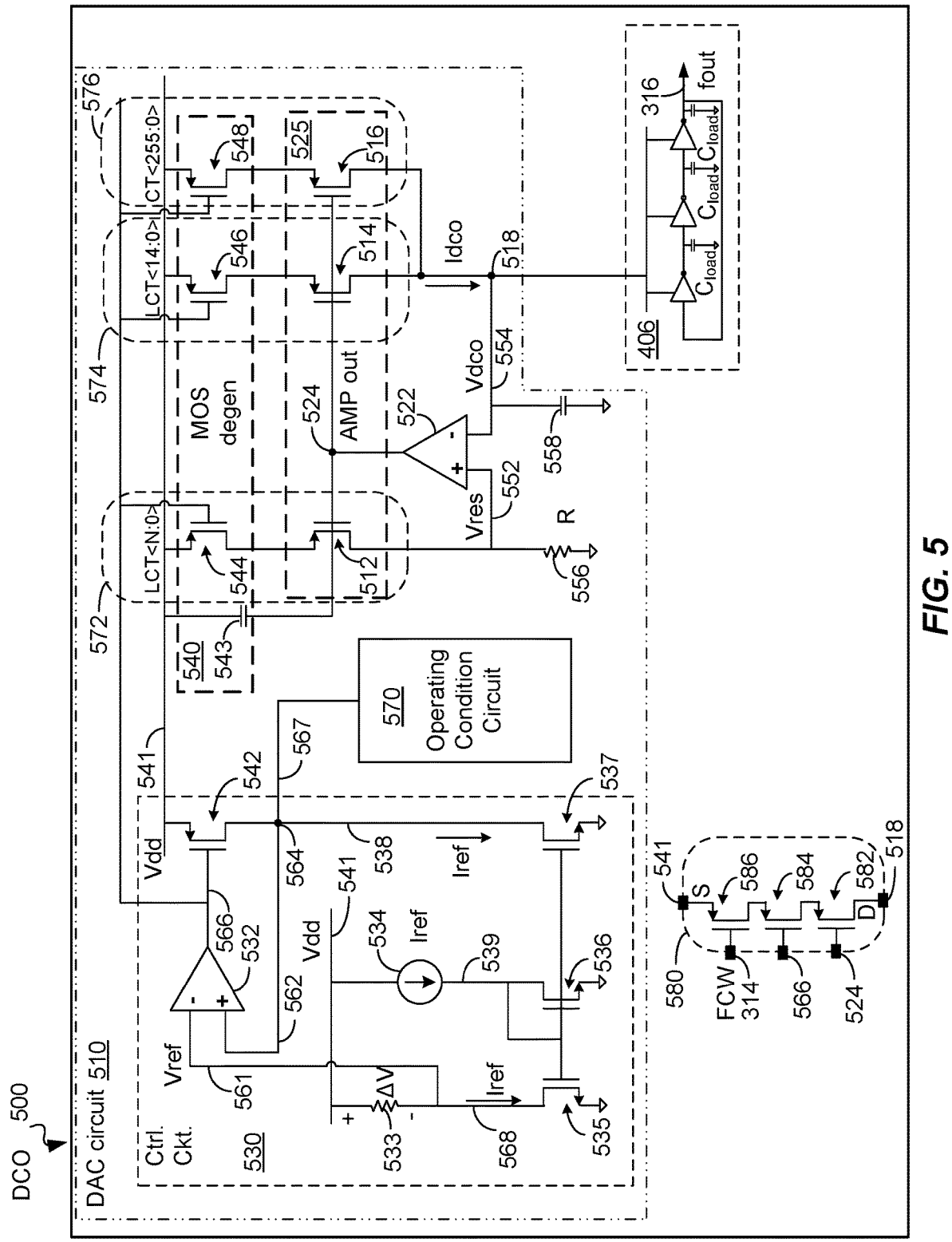
FIG. 5 is a detailed schematic diagram of an exemplary embodiment of a DCO of FIG. 3 or FIG. 4.

FIG. 5 is a detailed schematic diagram of an exemplary embodiment 500 of a digitally controlled oscillator (DCO) of FIG. 3 or FIG. 4. In an exemplary embodiment, the DCO 500 includes a digital-to-analog converter (DAC) circuit 510 and a ring oscillator 406 (FIG. 4). In an exemplary embodiment, the DAC circuit 510 comprises a plurality of DAC transistor devices 512, 514 and 516. In an exemplary embodiment, the DAC transistor devices 512, 514 and 516 may be implemented using P-type Metal Oxide Semiconductor (PMOS) transistor devices, and may be configured to generate a current (Idco) on connection 518 that may be used to control the frequency of the ring oscillator 406. The DAC transistor devices 512, 514 and 516 may also be referred to as DAC PMOS transistor devices.

The value of the current Idco on connection 518 is proportionally related to and controls the output frequency of the ring oscillator 406, and, when implemented in a phase locked loop (PLL) circuit, may form the frequency output, fout, on connection 316 (FIG. 3 and FIG. 4) of the PLL circuit. The frequency output, fout, of the ring oscillator 406 increases with the value of the current, Idco, on connection (node) 518, such that as the current, Idco, on connection 518 increases, the frequency, fout, on connection 316 proportionally increases and as the current, Idco, on connection 518 decreases, the frequency, fout, on connection 316 proportionally decreases. The connection 518 represents the output of the DAC circuit 510 and the input to the ring oscillator 406. In some applications, it is desirable for a PLL to have a wide tuning range as long as the maximum jitter requirement (1/f noise) is met so that such a PLL can cover a wide range of output frequencies. Since the frequency output, fout, increases with the current, Idco, it is generally beneficial to provide a large range for the DAC output current in order to implement a wide tuning range PLL.

The DAC circuit 510 also comprises an operational amplifier (OpAmp) 522 configured to equalize the voltage input Vres, at the non-inverting input 552 of the OpAmp 522, and the voltage input Vdco, at the inverting input 554 of the OpAmp 522. The OpAmp 522 is configured to linearize the frequency response of the output, fout, of the ring oscillator 406 by controlling the voltage provided to the gate terminals of the DAC transistor devices 512, 514 and 516 at node 524, such that the frequency of the output, fout, responds linearly to the frequency code word (FCW) that enables the DAC transistor devices 512, 514 and 516, as will be described below. In other embodiments, components for linearizing the frequency response of the output, fout, are omitted.

In accordance with an exemplary embodiment, the DAC circuit 510 also comprises a number of additional, non-DAC transistor devices 542, 544, 546 and 548. In an exemplary embodiment, the non-DAC, transistor devices 542, 544, 546 and 548 may be implemented as PMOS devices, and may be configured to operate in the triode region, such that the on-resistance, Ron, of each of the non-DAC transistor devices 542, 544, 546 and 548 is controlled by its respective gate voltage and also scales inversely proportional to its overdrive voltage. As used herein, the term "overdrive voltage", (Vov), for an NMOS transistor device is equal to the devices' gate-source voltage (Vgs) minus the NMOS threshold voltage (Vthn); and for a PMOS transistor device, the overdrive voltage, Vov, is equal to the source-gate voltage (Vsg) minus the absolute PMOS threshold voltage (abs(Vthp)) (i.e. for NMOS, Vov=Vgs−Vthn and for PMOS, Vov=Vsg−abs(Vthp)). In the configuration shown in the DAC circuit 510, the non-DAC transistor devices 544, 546 and 548 are used to degenerate transistors 512, 514 and 516, respectively, and in such an exemplary embodiment, may also be referred to as MOS degeneration transistor devices. The non-DAC transistor devices 544, 546 and 548 may comprise an active MOS degeneration circuit 540. While not considered a MOS degeneration transistor device, the non-DAC transistor device 542 also functions as a voltage dependent resistance, and functions as a reference non-DAC transistor device for the non-DAC transistor devices 544, 546 and 548. A gate of each of the non-DAC transistor devices 542, 544, 546 and 548 is coupled to a control circuit 530 over connection 566. In an exemplary embodiment, the control circuit 530 may be interchangeably referred to as a bias circuit, a MOS adjustment circuit, or a degeneration MOS bias circuit.

In applications where a wide tuning range PLL is desired, the DAC circuit 510 may be configured to supply a wide range of output current, Idco, in order to cover the desired frequency range of the DCO 500 to support the wide tuning range of the PLL. In such applications, multiple MOS tuning units may be used in the DAC to provide the desired range of output current, Idco. For example, each of a selectively enabled MOS tuning unit may provide a certain amount of current, with the total current provided by the selectively enabled MOS tuning units comprising the output current, Idco.

In the exemplary embodiment of FIG. 5, a large ctune (LCT) unit 572, a large ctune (LCT) unit 574, and a ctune (CT) unit 576 may be configured as MOS tuning units in the DAC circuit 510, for example in order to selectively contribute a portion of current to the output current, Idco. In the configuration illustrated in FIG. 5, the large ctune (LCT) unit 572 comprises transistors 544 and 512; and the large ctune (LCT) unit 574 comprises transistors 546 and 514. Similarly, the ctune (CT) unit 576 comprises transistors 548 and 516. In the exemplary embodiment shown in FIG. 5, the difference between the CT unit 576 and the LCT units 572 and 574 is that the transistors 544, 512, 546 and 514 in the LCT units 572 and 574 are larger than the transistors 548 and 516 in the CT unit 576. Similarly, a switch transistor (not shown) in the LCT units 572 and 574 is larger than a switch transistor (not shown) in the CT unit 576. In an exemplary embodiment, the transistors in the LCT units 572 and 574 may be 48 times (48×) larger than the transistors in the CT unit 576. Generally, the larger the transistor device, the smaller the resistance. In an exemplary embodiment, each of the LCT unit 572, LCT unit 574 and the CT unit 576 represents one of a number of LCT units and CT units. In the exemplary embodiment shown in FIG. 5, there are N+1 LCT units 572 (LCT<N:0>), 15 LCT units 574 (LCT<14:0>) and 256 CT units 576 (CT<255:0>). In an exemplary embodiment, the N+1 LCT units 572 are always on. In an exemplary embodiment, the state of each of the 15 LCT units 574 is controlled by information contained in the DCO code (the FCW) provided to the 15 LCT units 574. Similarly, the state of each of the 256 CT units 576 is controlled by information contained in the DCO code represented by the FCW provided to the 256 CT units 576. For example, if the FCW is provided by a 12-bit wide bus, then the FCW can be written as FCW<11:0>. The lower eight (8) bits (FCW<7:0>) of the FCW can be used to control the state of the 256 CT units 576; and the upper four (4) bits (FCW<11:8>) of the FCW can be used to control the state of the 15 LCT units 574. When a CT unit 576 or an LCT unit 574 is on, it supplies a certain amount of current, defined by the size of the transistors in the CT unit 576 and the LCT unit 574. To support higher output frequencies (e.g., higher frequencies of fout on connection 316), more of the LCT units 574 and CT units 576 are turned on by the DCO FCW, resulting in a higher current, Idco, appearing at node 518, and a resultant higher output frequency, fout, on connection 316. Similarly, at lower output frequencies, fewer of the LCT units 574 and CT units 576 are turned on, resulting in a lower current, Idco, and lower output frequency, fout.

An exemplary MOS tuning unit is shown using reference numeral 580. In an exemplary embodiment, the MOS tuning unit 580 may be a generic representation of any tuning unit of the large ctune (LCT) unit 572 or 574, or the ctune (CT) unit 576 shown in FIG. 5. However, as shown in FIG. 5, the large ctune (LCT) units 572 and 574, and the ctune (CT) unit 576 are shown in simplified form without a switch transistor device 586 being shown. Each tuning unit of the large ctune (LCT) units 572 and 574, and the ctune (CT) unit 576, however, could be implemented having an architecture similar to that of the tuning unit 580. The MOS tuning unit 580 may comprise a switch transistor device 586, a non-DAC transistor device 584 (e.g., a degeneration transistor device), and a DAC transistor device 582. The switch transistor device 586 may be configured to receive the frequency code word (FCW) at its gate over connection 314 as an enable signal and may have its source coupled to the system voltage, Vdd, over connection 541. Thus, the tuning unit 580 is configured to be selectively enabled based on the FCW; a value of the FCW will determine whether the switch 586 is open or closed, and thus whether current is provided by the tuning unit 580. The drain of the switch transistor device 586 may be coupled to the source of the non-DAC transistor device 584; and the drain of the non-DAC transistor device 584 may be coupled to the source of the DAC transistor device 582. The drain of the DAC transistor device 582 may be coupled to the node 518. The gate of the non-DAC transistor device 584 may be coupled to connection 566 and the gate of the DAC transistor device 582 may be coupled to connection 524. In an exemplary embodiment for a given MOS tuning unit 580, the relative sizes of the switch transistor device 586, non-DAC transistor device 584 and DAC transistor device 582 may be the same. Further, the non-DAC transistor device 584 and DAC transistor device 582 may be configured to flow a defined amount of current based on their sizes and the bias signals at respective gate connections 566 and 524 when the switch transistor device 586 is closed/enabled.

A capacitor 543 is coupled between the system voltage, Vdd, on connection 541 and the gates of the DAC transistor devices 512, 514 and 516. A resistor 556 is coupled between the drain of the DAC transistor device 512 and a system ground. A capacitor 558 is coupled between the inverting input of the OpAmp 522 at connection 554 and a system ground. The OpAmp 522 equalizes the voltage, Vres, on connection 552 with the voltage, Vdco, on connection 554, and linearizes the frequency response of the ring oscillator 406, as mentioned above. The output frequency of the ring oscillator 406 on connection 316 is linearly proportional to the DAC code represented by the FCW, such that the output frequency, fout=$C/(R*C_{load})$*FCW. In this example, $C_{load}$ is the effective capacitive load at the output of each inverter stage in the ring oscillator 406, R is the value of the resistance 556, and C is a constant determined by the size ratio of the LCT unit 574, and the CT unit 576, and the number of LCT units 572.

In an exemplary embodiment, the non-DAC transistor devices 544, 546 and 548 are coupled at an input side of the DAC circuit 510, that is, the drain terminals of the non-DAC transistor devices 544, 546 and 548 are coupled to the source terminals of the DAC transistor devices 512, 514 and 516, respectively. In an exemplary embodiment, the non-DAC transistor devices 544, 546 and 548 may comprise the MOS degeneration circuit 540. In an exemplary embodiment, the DAC transistor devices 512, 514 and 516 may collectively be referred to as DAC transistor devices 525. Although three DAC transistor devices 512, 514 and 516, and three respective non-DAC transistor devices 544, 546 and 548 are illustrated at the input, that is, the drain terminals of the non-DAC transistor devices 544, 546 and 548 are coupled to the source terminals of the DAC transistor devices 512, 514 and 516, other numbers of DAC transistor devices and non-DAC transistor devices are possible, depending on implementation.

In some implementations, at lower offset frequencies, the noise contributed by the DAC transistor devices 512, 514 and 516 (i.e., PMOS transistor devices) to the current, Idco, on connection 518 is difficult to eliminate. Adding a degenerative resistance to the source terminals of the DAC transistor devices 512, 514 and 516 may substantially reduce the low frequency noise generated by the DAC transistor devices 512, 514 and 516. A conventional resistance may be difficult to implement in the circuit layout, and may not scale well with the sizes of the DAC transistor devices 512, 514 and 516. For example, using a conventional resistance in each of these DAC tuning units (LCT units 572 and 574, CT unit 576) may result in a DAC having a very large area, which is undesirable.

In accordance with an exemplary embodiment, a degenerative resistance added to the source (i.e., the input) of each of the DAC transistor devices 512, 514 and 516, may be implemented using the non-DAC transistor devices 544, 546 and 548, respectively, as degenerative resistances for the respective DAC transistor devices 512, 514 and 516. The value of the resistance provided by each of the non-DAC transistor devices 544, 546 and 548 can be controlled by the gate voltage of the non-DAC transistor devices 542, 544, 546 and 548 while operating the non-DAC transistor devices 542, 544, 546 and 548 in the triode region.

In accordance with an exemplary embodiment, the non-DAC transistor device 542 may be configured as a reference degeneration MOS transistor device, or an adjustment transistor device, to help define a bias voltage based on a reference current, Iref, and may also be configured to operate in the triode region, as will be described below. In an exemplary embodiment, the non-DAC transistor device 542 may be interchangeably referred to herein as a reference degeneration MOS transistor device, or an adjustment transistor device.

A source of the non-DAC transistor device 544 is coupled to the system voltage, Vdd, on connection 541 and a drain of the non-DAC transistor device 544 is coupled to the source of the DAC transistor device 512. A source of the non-DAC transistor device 546 is coupled to the system voltage, Vdd, on connection 541 and a drain of the non-DAC transistor device 546 is coupled to the source of the DAC transistor device 514. A source of the non-DAC transistor device 548 is coupled to the system voltage, Vdd, on connection 541 and a drain of the non-DAC transistor device 548 is coupled to the source of the DAC transistor device 516. The drain of the DAC transistor device 512 is coupled to system ground through the resistor 556. The drain of the DAC transistor device 514 is coupled to the drain of the DAC transistor device 516, and provides the current output, Idco, of the DAC circuit 510 at node 518.

In an exemplary embodiment, the control circuit 530, comprises a bias OpAmp 532, a resistance 533, the reference degeneration MOS transistor device 542, a current source 534, N-type MOS (NMOS) transistor devices 535 and 536, and an NMOS transistor device 537. The NMOS transistor device 536 is connected as a diode. An inverting input of the bias OpAmp 532 is configured to receive a reference voltage, Vref, on connection 561, and a non-inverting input of the bias OpAmp 532 on connection 562 is configured to receive an output of the reference degeneration MOS transistor device 542 at node 564, which is also coupled to the drain of the reference degeneration MOS transistor device 542.

The current source 534 produces the reference current, Iref, that flows into the drain of the diode-connected NMOS transistor device 536 on connection 539. The NMOS transistor devices 535, 536 and 537 form a current mirror, and as such, the reference current, Iref, also flows into the drain of the NMOS transistor device 535 on connection 568, and flows into the drain of the NMOS transistor device 537 on connection 538.

The reference current, Iref, appearing on connection 538 is coupled to the node 564 and to the drain of the reference degeneration MOS transistor device 542. The output of the bias OpAmp 532 is provided over connection 566 to the gate of each of the non-DAC transistor devices 542, 544, 546 and 548, thereby controlling the gate voltage, and the resistance value of each of the non-DAC transistor devices 542, 544, 546 and 548 using a bias voltage developed by the control circuit 530.

The resistor 533 is coupled between the system voltage, Vdd, on connection 541 and the drain of the NMOS transistor device 535. The value ΔV appears across the resistor 533, such that the value of Vref, which is applied to the inverting input of the bias OpAmp 532 on connection 561, is an amount ΔV lower than the system voltage, Vdd, on connection 541.

The OpAmp 532 ensures that the input voltages on connections 561 and 562 will be substantially equalized, such that the voltage on node 564 is driven to equal the reference voltage, Vref on connection 561. Since the reference voltage, Vref, is ΔV lower than the system voltage, Vdd, the voltage on node 564 will also be ΔV lower than the system voltage, Vdd. In this manner, the drain-source voltage, Vds, of the reference degeneration MOS transistor device 542 is also ΔV.

While ΔV is sufficiently low and there is sufficient current flowing in the reference degeneration MOS transistor device 542, the OpAmp 532 will drive the gate of the reference degeneration MOS transistor device 542 such that the reference degeneration MOS transistor device 542 stays in the triode region. Under this condition, the on-resistance, Ron, of the reference degeneration MOS transistor device 542 is the same as the resistance of resistor 533 because the on-resistance, Ron, of the reference degeneration MOS transistor device 542 is defined by the voltage across the source-drain terminals (i.e. Vsd=ΔV=Iref*(resistance of resistor 533) of the reference degeneration MOS transistor device 542 divided by the current flowing in the reference degeneration MOS transistor device 542. As a result, the on-resistance, Ron, of the reference degeneration MOS transistor device 542 is ΔV divided by Iref, which is equal to the resistance of resistor 533.

While the reference degeneration MOS transistor device 542 is in the triode region, the reference degeneration MOS transistor device 542 behaves as a resistor and its resistance is controlled by the gate voltage on connection 566. Because the non-DAC transistor devices 544, 546 and 548 are electrically similar to the reference degeneration MOS transistor device 542, the behavior of the non-DAC transistor devices 544, 546 and 548 will be similar to that of the reference degeneration MOS transistor device 542, even though they may provide different resistances based on their relative sizes. As stated above, given equivalent size, the on-resistance, Ron, of a non-DAC transistor device 542, 544, 546 and 548 can be configured to be substantially equal to the resistance of resistor 533. Since the voltage at the gate of the non-DAC transistor devices 544, 546 and 548 is equal to the voltage of the gate of the reference degeneration MOS transistor device 542, the on-resistance, Ron, of the non-DAC transistor devices 544, 546 and 548 will be approximately equal to the on-resistance, Ron, of the reference degeneration MOS transistor device 542 if the non-DAC transistor devices 544, 546 and 548 are the same size as the reference degeneration MOS transistor device 542. In the exemplary embodiment shown in FIG. 5, however, the relative size of the reference degeneration MOS transistor device 542 may be m=10, the relative size of the non-DAC transistor devices 544 and 546 may be m=48, and the relative size of the non-DAC transistor device 548 may be m=1, so that their respective on-resistance is proportional to their relative sizes. In the example shown in FIG. 5, because of the difference in size among the non-DAC transistor devices 542, 544, 546 and 548, the respective resistances will be inversely proportional to the respective relative size differences, whereby a larger transistor device generally provides a smaller resistance with other factors being substantially equal. For example, when the size of the non-DAC transistor devices 544 and 546 is 48 times of size the non-DAC transistor device 548, the on-resistance, Ron, of the transistor devices 544 and 546 will be ⅟₄₈ of the on-resistance, Ron, of the non-DAC transistor device 548, because the on-resistance, Ron, is inversely proportional to the size of the transistor devices. Given the relative sizes of the non-DAC transistor devices 544, 546 and 548 mentioned above, the non-DAC transistor device 548 will provide a larger resistance than the non-DAC transistor devices 546 and 544.

The value of the resistor 533 is chosen based on the desired degeneration resistance of the non-DAC transistor devices 544, 546 and 548. Depending on implementation, the relative sizes of the non-DAC transistor devices 542, 544, 546 and 548 can also be scaled differently than that mentioned above to obtain the desired on-resistance, Ron, of the non-DAC transistor devices 544, 546 and 548, suitable for the LCT units 572 and 574, and CT unit 576.

The DAC circuit 510 also comprises an operating condition circuit 570 coupled to the node 564 over connection 567. The operating condition circuit 570 is configured to determine one or more operating conditions, aspects or parameters of the DAC circuit 510, and may also be configured to provide a feedback signal to the control circuit 530 that can be used to additionally control the current flowing through the node 564, thus controlling the current flowing through the reference degeneration MOS transistor device 542. The operating condition circuit 570 may also be referred to as a sense circuit.

In an exemplary embodiment, the operating condition circuit 570 may be configured to sense the current at the node 518 being provided to the ring oscillator 406 and provide a feedback signal to the control circuit 530 based on the current, Idco, which is related to the frequency, fout, at connection 316, to optimize the voltage headroom of the DAC circuit 510 over a wide frequency range.

In another exemplary embodiment, the operating condition circuit 570 may be configured to sense the voltage between the connection 541, Vdd, and system ground, and provide a feedback signal to the control circuit 530 at node 564 based on the system voltage, Vdd, to optimize the voltage headroom of the DAC circuit 510 over a wide voltage range and to improve the 1/f noise performance of the DAC circuit 510.

In another exemplary embodiment, the operating condition circuit 570 may be configured to sense both the current at the node 518 being provided to the ring oscillator 406 and the voltage between the connection 541, Vdd, and system ground, and provide a feedback signal to the control circuit 530 at node 564 based on the current, Idco, and the system voltage, Vdd, to optimize the voltage headroom of the DAC circuit 510 over a wide voltage range and to improve the 1/f noise performance of the DAC circuit 510.

Figure 6:
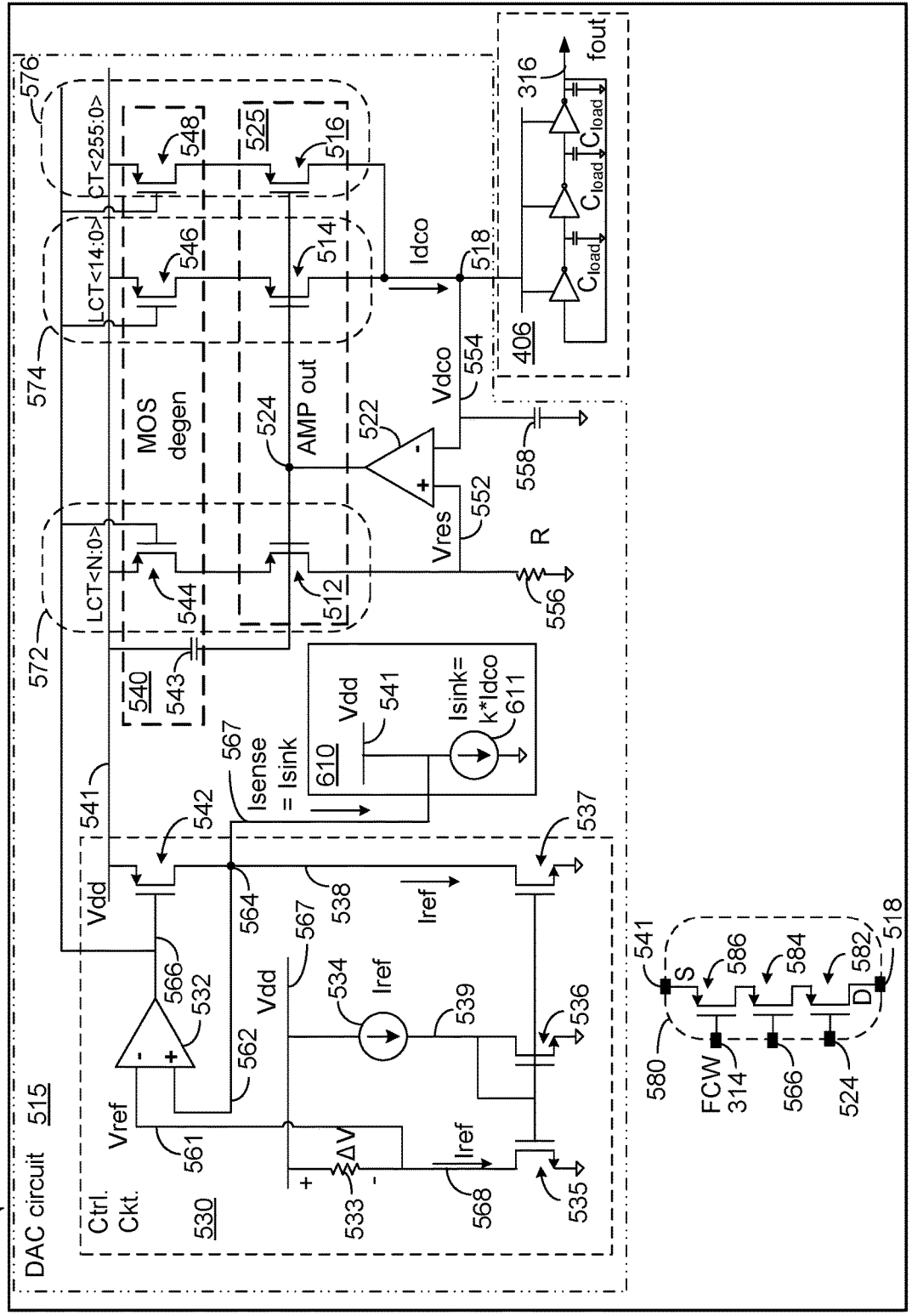
FIG. 6 is a detailed schematic diagram of an exemplary embodiment of the digitally controlled oscillator (DCO) of FIG. 5, including an exemplary embodiment of an operating condition circuit of FIG. 5.

FIG. 6 is a detailed schematic diagram of an exemplary embodiment of a digitally controlled oscillator (DCO) 600, similar to the DCO of FIG. 5, including an exemplary embodiment of an operating condition circuit of FIG. 5. Elements in FIG. 6 that are identical to corresponding elements in FIG. 5 are numbered identically and are not described again in detail. In the exemplary embodiment of FIG. 6, the operating condition circuit 610 is represented by a current source 611 configured to be responsive to the output current, Idco, on connection 518. The output current, Idco, of the DAC circuit 515 increases with the output frequency of the ring oscillator 406, such that in addition to being responsive to the output current, Idco, on connection 518, the operating condition circuit 610 is also responsive to the output frequency, fout, of the ring oscillator 406 because the output current, Idco, on connection 518 increases with the output frequency, fout, on connection 316. In an exemplary embodiment, the current source 611 generates a sense current, Isense, where in an exemplary embodiment, the sense current, Isense, is equal to a sink current, Isink, developed by the current source 611. As used herein, the term "sink current" refers to a current sunk from, or received by, an NMOS transistor device, and the term "source current" refers to a current that is sourced, or supplied, from a PMOS transistor device. In an exemplary embodiment, the current, Isink, is equal to the current, Idco, on connection 518 multiplied by a scaling factor, k. In other words, the current Idco on connection 518 is scaled by a scaling factor, k, to generate the current, Isink.

In an exemplary embodiment, the current, Isink (which is the same as Isense in this example), may be summed to the node 564, resulting in a total current flowing through the reference degeneration MOS transistor device 542 in addition to the current Iref, such that in this example, the total current flowing through the reference degeneration MOS transistor device 542 comprises Iref and Isense.

The OpAmp 532 maintains the voltage at connection 564 at the same voltage level as the voltage Vref on connection 561 regardless of the amount of current flowing through the reference degeneration MOS transistor device 542, such that the drain-source voltage, Vds, across the reference degeneration MOS transistor device 542 remains constant regardless of the amount of current flowing through the reference degeneration MOS transistor device 542.

As stated above, when the operating condition circuit is turned on, the current flowing through the reference degeneration MOS transistor device 542 is (Iref+Isense). Furthermore, since Isense increases with the output frequency, fout, of the ring oscillator 406, the current flowing through the reference degeneration MOS transistor device 542 also increases with the output frequency, fout, of the ring oscillator 406. As a result, the on-resistance, Ron decreases with the output frequency, fout, of the ring oscillator 406. In this manner, the voltage headroom of the DAC circuit 515 is tuned (for example, can be optimized) because the on-resistance, Ron, of the reference degeneration MOS transistor device 542 is reduced when the output frequency, fout, of the ring oscillator 406 increases. In this exemplary embodiment, the current, Isense, developed by the current source 611 is proportional to the amount of current, Idco, at node 518, and increases with the output frequency, fout, on connection 316, such that the operating condition circuit 610 may improve the voltage headroom response of the DAC circuit 515 responsive to the current, Idco, and the output frequency, fout.

In an exemplary embodiment, the reference voltage, Vref, provided to the inverting input of the Opamp 532 on connection 561 can be defined by the voltage drop, ΔV, across the resistor 533. The voltage drop, ΔV, across the resistor 533 is also related to the reference current, Iref, flowing through the NMOS transistor device 535 on connection 568 and the NMOS transistor device 537 on connection 538. Generally, increasing Iref and/or increasing Isense increases the current flowing in the reference degeneration MOS transistor device 542. To accommodate the increased current in the reference degeneration MOS transistor device 542, the OpAmp 532 reduces the voltage on connection 566 while keeping the voltage on the non-inverting input 562 (same as the voltage at node 564) equal to the voltage on the inverting input, 561, resulting in reduced on-resistance, Ron, of the reference degeneration MOS transistor device 542 as current flowing through the reference degeneration MOS transistor device 542 increases. In an exemplary embodiment, this reduced voltage on the output of the OpAmp 532 also reduces the on-resistance, Ron, of the non-DAC transistor devices 544, 546 and 548 because the non-DAC transistor devices 544, 546 and 548 are in the triode region, similar to the reference degeneration MOS transistor device 542.

Figure 7:
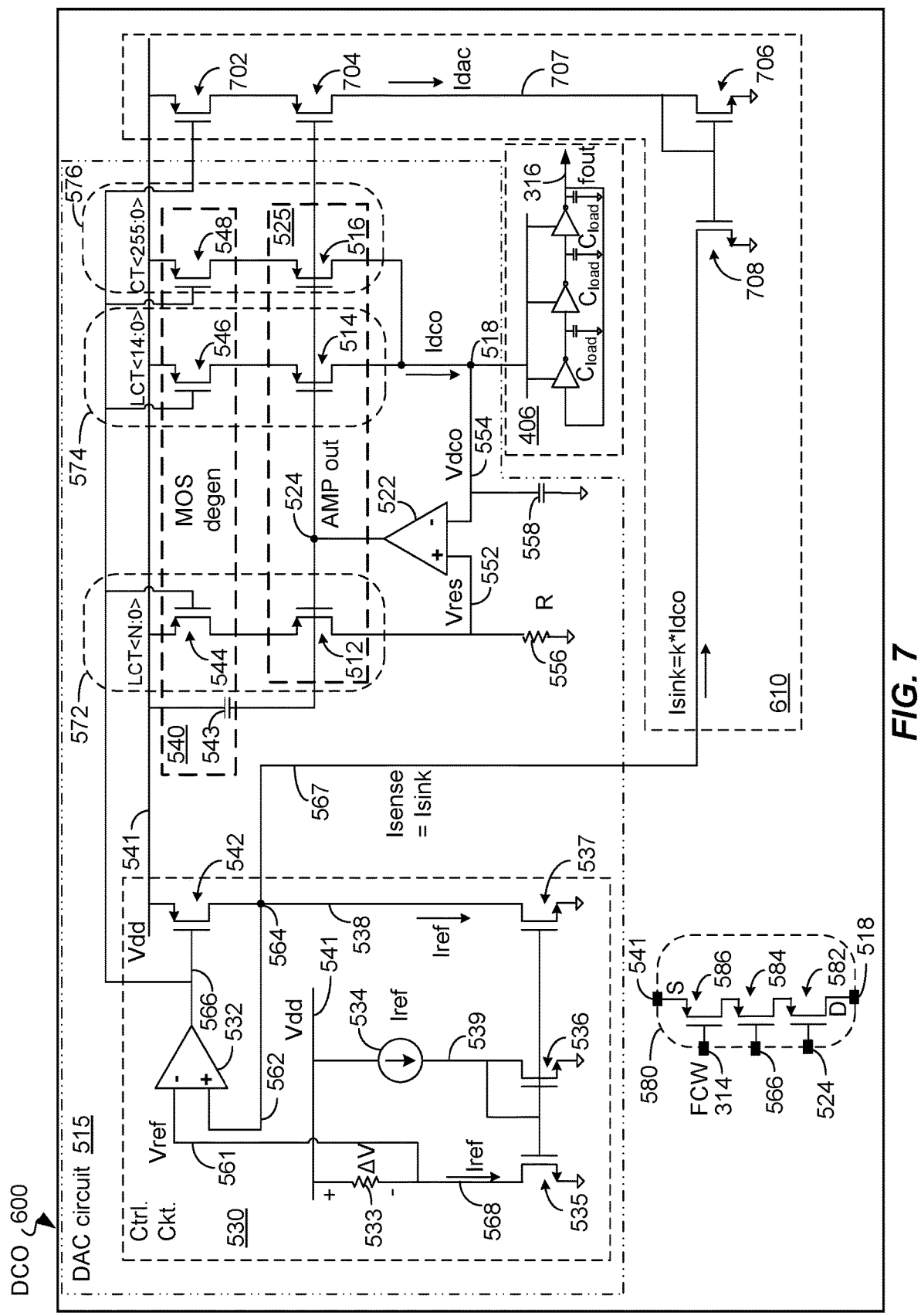
FIG. 7 is a schematic diagram of an exemplary embodiment of a DCO showing an exemplary embodiment of the operating condition circuit of FIG. 6 in greater detail.

FIG. 7 is a schematic diagram of the DCO 600 showing an exemplary embodiment of the operating condition circuit 610 of FIG. 6 in greater detail. In an exemplary embodiment, the operating condition circuit 610 comprises PMOS transistor devices 702 and 704, and comprises NMOS transistor devices 706 and 708. In an exemplary embodiment, the current Isense=k*Idco, where "k" is a scalar value configured to make the current Isense a scaled version of the current Idco at node 518. For example, the current mirror formed by the NMOS devices 706 and 708 may generate the current Isense.

The amount of the current flowing in PMOS transistor devices 702 and 704, Idac, on connection 707 increases with the DAC code (the FCW) in a similar manner as the FCW controls the output current, Idco, of the DAC circuit 515. For example, when the output current, Idco, of the DAC circuit on connection 518 increases or decreases, the current, Idac, through the PMOS transistor devices 702 and 704 also increases or decreases proportionally. The current, Idco, is controlled by the FCW. In an example implementation, the relative sizes of the transistor devices 702 and 704 can be scaled such that Idac is a small portion of Idco to reduce the overall current consumption of the DAC circuit 515.

The current, Isense (which is the same as the current, Isink, in this example), on connection 567 may be coupled to the node 564 from the drain of the NMOS device 708. In an exemplary embodiment, the current, Isense, at node 564 increases the total current flowing through the reference degeneration MOS transistor device 542.

In example embodiments, when the PLL and DCO (or VCO) operate at very high frequency, the current Idco is also very high in order to sustain the high frequency operation. As a result, the voltage drop, I*R, across the non-DAC transistor devices 544, 546, and 548 is high, assuming the on-resistance, Ron, of the non-DAC, transistor devices 544, 546, and 548 remains constant. The on-resistance, Ron, of the non-DAC, transistor devices 544, 546 and 548 is also referred to as the degeneration resistance. In addition, during high frequency operation, the voltage, Vdco, on connection 554 and on node 518 is also very high because there is more current flowing into the ring oscillator 406 during high frequency operation than there is during low frequency operation. Therefore, the available voltage headroom for the DAC circuit 515 is limited because both the I*R voltage drop across the non-DAC, transistor devices 544, 546 and 548 is high, and the voltage, Vdco, at node 518 is also high. This may be an issue if the system voltage, Vdd, is sought to be minimized, for example to reduce power consumption.

Under the above-mentioned high frequency operation, it is possible to reduce the degeneration resistance, the on-resistance, Ron, of the non-DAC transistor device 542, and accordingly, reduce the scaled version of Ron across the non-DAC, transistor devices 544, 546 and 548, in order to alleviate the voltage headroom constraint. Regarding the scaled version of Ron across the non-DAC, transistor devices 544, 546 and 548, assuming that the reference degeneration MOS transistor device 542 is ten (10) times larger than the non-DAC transistor device 544, if the on-resistance, Ron, of the reference degeneration MOS transistor device 542 is 1 kohms, then the Ron of the non-DAC transistor device 544 will be 10×1 kohm=10 kohm. In the example shown, the relative resistances of the reference degeneration MOS transistor device 542, the non-DAC transistor devices 544 and 546, and the non-DAC transistor device 548 will be inversely proportional to their relative sizes, as mentioned above.

Since the OpAmp 532 ensures that the reference degeneration MOS transistor device 542 operates in the linear (triode) region, the degeneration on-resistance, Ron, of the reference degeneration MOS transistor device 542 is a function of the voltage across it and the current flowing through it, such that Ron=ΔV/Iref. To lower the on-resistance, Ron, (and the scaled version of Ron defined by the sizes of the non-DAC transistor devices 544, 546 and 548), the current flowing through the reference degeneration MOS transistor device 542 can be increased. This can be achieved by flowing additional current, Isense, at the node 564, thus increasing the current flowing through the reference degeneration MOS transistor device 542. When this additional current, Isense, is added to the current Iref flowing through the reference degeneration MOS transistor device 542, the total current flowing through the reference degeneration MOS transistor device 542 is increased (i.e., the current flowing through non-DAC transistor device 542 is Iref+Isense) and the degeneration on-resistance, Ron, is thereby reduced because the voltage drop across the resistor 533 (ΔV) remains constant.

An example implementation as shown in FIG. 7 can be implemented to improve the voltage headroom constraint under high frequency operation. As shown in FIG. 7, the current, Isense, on connection 567 is a scaled version of Idco, where Isink=k*Idco. In other words, the total current flowing out of the reference degeneration MOS transistor device 542 is Iref+k*Idco, where k is a constant scaling factor, determined by the size ratio of the PMOS transistor devices 702 and 704, and NMOS transistor devices 706 and 708.

In an exemplary embodiment, at high frequencies, the total current flowing out of the reference degeneration MOS transistor device 542 is increased because the current, Idco, at node 518 is increased at high frequencies. Therefore, the total current flowing out of the reference degeneration MOS transistor device 542 is increased, resulting in lowered degeneration on-resistance, Ron, of the reference degeneration MOS transistor device 542, and consequently, lowered degeneration on-resistance, Ron, of the non-DAC transistor devices 544, 546 and 548. This reduced degeneration on-resistance, Ron, at high frequencies improves the voltage headroom of the DAC circuit 515 at high frequencies. This is important because the system voltage, Vdd, may be constrained by the desire for lower power consumption, while it may be desirable to maximize the clock speed of the DAC circuit 515, so accordingly, maximizing the voltage may allow the DAC circuit 515 to operate at higher speeds than if the voltage headroom is limited.

The DAC transistor devices 512, 514 and 516 are the main PMOS devices responsible for generating the DAC output current Idco. The DAC transistor devices 512, 514 and 516 should be configured to operate in the saturation region for proper operation. In contrast, the non-DAC transistor devices 544, 546 and 548 are MOS devices that are biased in the triode region and serve as linear resistances responsive to gate voltage. The DAC transistor devices 512, 514 and 516 in combination with the non-DAC transistor devices 544, 546 and 548 comprise a DAC having active MOS degeneration. In an exemplary embodiment, each DAC transistor device 512, 514 and 516 may be the same size as each respective non-DAC transistor device 544, 546 and 548, and may be configured to flow a defined amount of current related to their size when enabled by a respective switch transistor device (such as the switch transistor device 586). In the exemplary embodiment of FIG. 7, the DAC transistor device 512 is connected in series with the non-DAC transistor device 544, and can also be described as the DAC transistor device 512 being degenerated by the non-DAC transistor device 544. Since the DAC transistor devices 512, 514 and 516 are degenerated by the non-DAC transistor devices 544, 546 and 548, respectively, the transconductance of the DAC transistor devices 512, 514 and 516 is reduced, which may result in less noise contribution than if the DAC transistor devices 512, 514 and 516 were not degenerated, thus reducing the overall 1/f noise of the DAC circuit 515.

Figure 8:
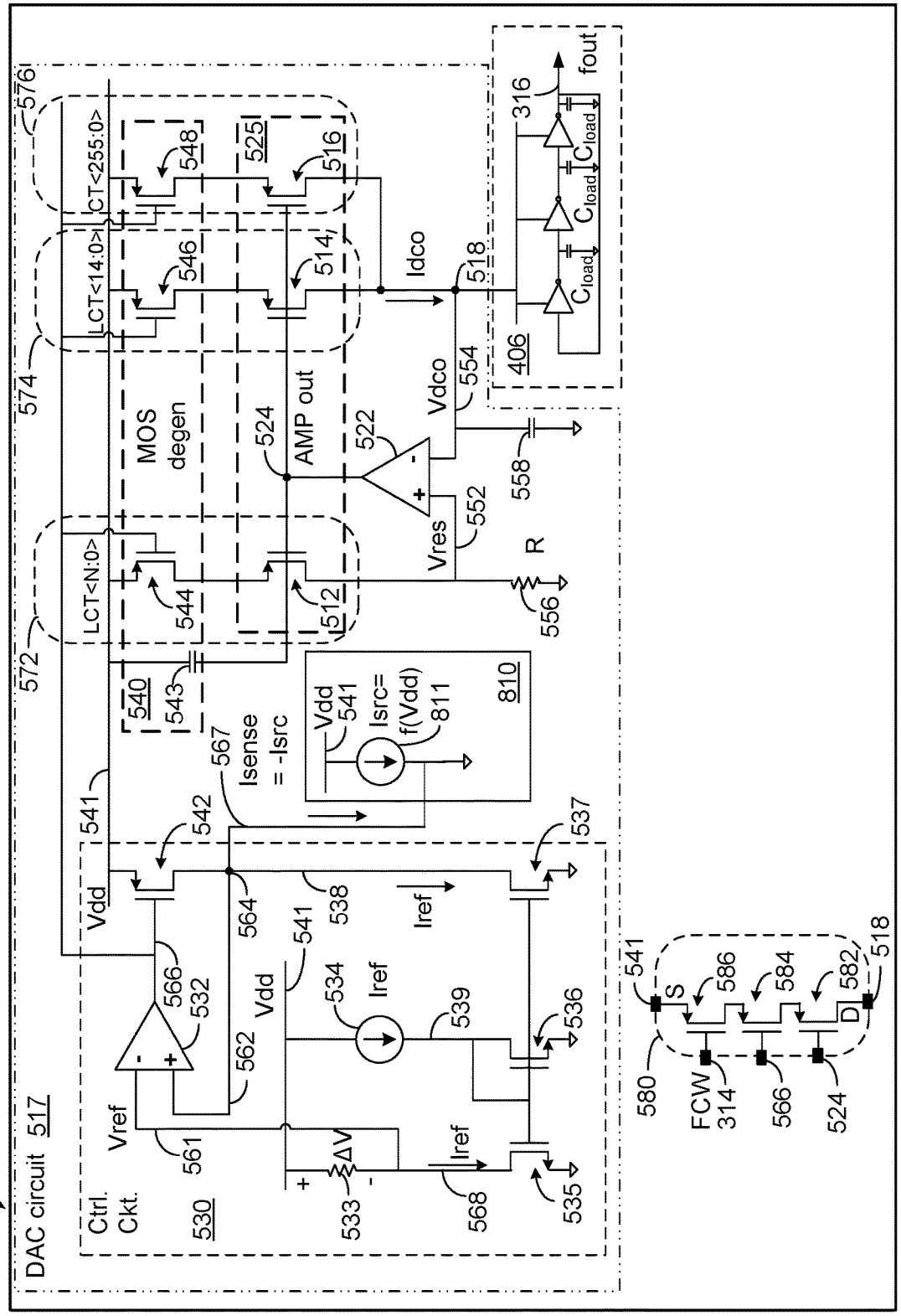
FIG. 8 is a detailed schematic diagram of an exemplary embodiment of a digitally controlled oscillator (DCO), similar to the DCO of FIG. 5, including an exemplary embodiment of an operating condition circuit of FIG. 5.

FIG. 8 is a detailed schematic diagram of an exemplary embodiment of a digitally controlled oscillator (DCO) 800, similar to the DCO of FIG. 5, including an exemplary embodiment of an operating condition circuit of FIG. 5. Elements in FIG. 8 that are identical to corresponding elements in FIG. 5 are numbered identically and are not described again in detail. In the exemplary embodiment of FIG. 8, the operating condition circuit 810 is represented by a current source 811 configured to be responsive to the system voltage, Vdd, on connection 541. In this exemplary embodiment, the magnitude of the sense current, Isense, is equal to the magnitude of a source current, Isrc, developed by the current source 811, where Isense=−Isrc. For example, Isrc is always positive or 0, such that when Isrc increases, the current flowing through the reference degeneration MOS transistor device 542 decreases, causing the on-resistance, Ron, of the reference degeneration MOS transistor device 542 to increase. Conversely, when Isrc decreases, the current flowing through the reference degeneration MOS transistor device 542 increases, causing the on-resistance, Ron, of the reference degeneration MOS transistor device 542 to decrease. Accordingly, when the operating condition circuit 810 is turned on, the on-resistance, Ron, of the reference degeneration MOS transistor device 542 is equal to ΔV/(Iref−Isrc).

In an exemplary embodiment, the current, Isrc, is a function, "f", of the system voltage, Vdd. In other words, the output current, Isrc, changes with the system voltage, Vdd. The current Isrc may be a function of the system voltage, Vdd, such that as the voltage level of Vdd increases, the output of the current source 811 increases and as the voltage level of Vdd decreases, the output of the current source 811 decreases.

In an exemplary embodiment, if the system voltage, Vdd, decreases, then the current Isrc decreases, thus increasing the current through the reference degeneration MOS transistor device 542. The OpAmp 532 responds to this increased current in the reference degeneration MOS transistor device 542 by decreasing the voltage on the connection 566 such that the voltage on the non-inverting input 562 remains the same as the voltage on the inverting input 561. In an exemplary embodiment, the reference voltage, Vref, provided to the inverting input of the OpAmp 532 on connection 561 can be defined by the voltage drop, $\Delta V$, across the resistor 533. Because a decrease in the system voltage, Vdd, decreases the current, Isrc, in the current source 811, the current flowing in the reference degeneration MOS transistor device 542 increases while the drain-source voltage, Vds across the reference degeneration MOS transistor device 542 is kept constant (i.e. $\Delta V$), and the resulting on-resistance, Ron, of the reference degeneration MOS transistor device 542 is decreased because Ron=$\Delta V$/(current in the reference degeneration MOS transistor device 542). The decreased voltage on the output of the OpAmp 532 on connection 566 also proportionally decreases the on-resistance, Ron, of the non-DAC transistor devices 544, 546 and 548, as described herein.

In contrast, in an exemplary embodiment, if the system voltage, Vdd, increases, then the current Isrc increases, which decreases the current flowing through the reference degeneration MOS transistor device 542. The OpAmp 532 responds to this decreased current in the reference degeneration MOS transistor device 542 by increasing the voltage on the connection 566 such that the voltage on the non-inverting input 562 remains the same as the voltage on the inverting input 561. In an exemplary embodiment, the reference voltage, Vref, provided to the inverting input of the OpAmp 532 on connection 561 can be defined by the voltage drop, $\Delta V$, across the resistor 533. Because an increase in the system voltage, Vdd, increases the current, Isrc, in the current source 811, and decreases the current flowing in the reference degeneration MOS transistor device 542 while keeping the drain-source voltage, Vds, across the reference degeneration MOS transistor device 542 constant (i.e. $\Delta V$), the resulting on-resistance, Ron, of the reference degeneration MOS transistor device 542 is increased because Ron=$\Delta V$/(current in the reference degeneration MOS transistor device 542). The increased voltage on the output of the OpAmp 532 on connection 566 also increases the on-resistance, Ron, of the non-DAC transistor devices 544, 546 and 548, as described herein.

In an exemplary embodiment, the current, Isrc, may be provided to the node 564 so that the current at node 564 (and the current flowing through the reference degeneration MOS transistor device 542) is responsive to the system voltage, Vdd. In an exemplary embodiment, if the system voltage, Vdd, decreases, then the on-resistance, Ron, of the reference degeneration MOS transistor device 542 also decreases, resulting in additional voltage headroom. If the system voltage, Vdd increases, then the on-resistance, Ron, of the reference degeneration MOS transistor device 542 also increases, resulting in a greater improvement in the 1/f noise performance.

Figure 9:
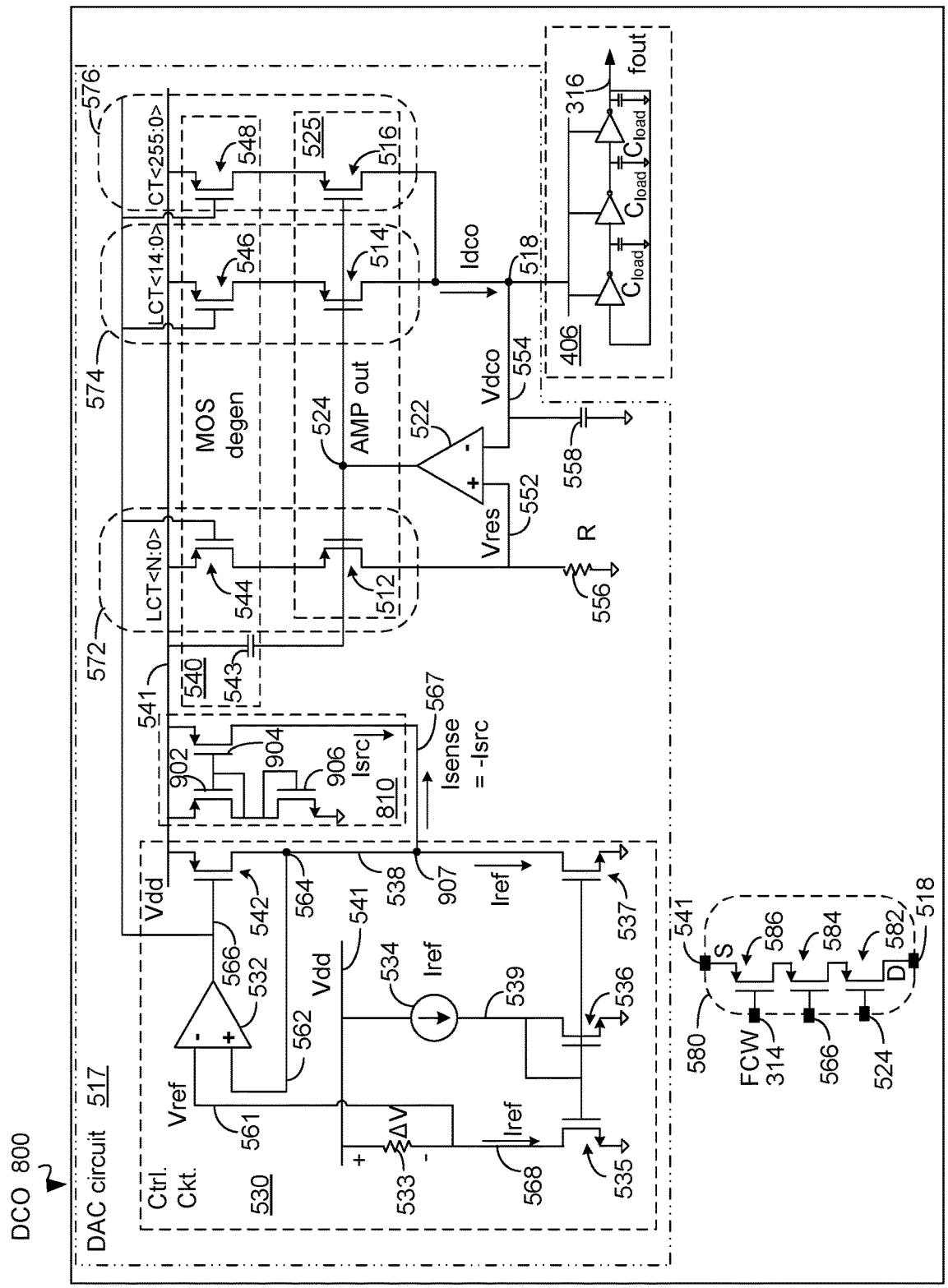
FIG. 9 is a schematic diagram of an exemplary embodiment of a DCO showing an exemplary embodiment of the operating condition circuit of FIG. 8 in greater detail.

FIG. 9 is a schematic diagram of the DCO 800 showing an exemplary embodiment of the operating condition circuit 810 of FIG. 8 in greater detail. The operating condition circuit 810 comprises PMOS transistor devices 902 and 904, and comprises NMOS transistor device 906. The current, Isrc, on connection 567 flows through the PMOS transistor device 904, and affects the current at the node 564, via the node 907, thus affecting the current flow through the reference degeneration MOS transistor device 542. In an exemplary embodiment, the current Isrc=f(Vdd), where "f" is a function of the system voltage, Vdd, on connection 541, and the associated current Isrc sources current on connection 567.

When the supply voltage, Vdd, decreases, the current flowing through the transistor device 904 decreases, increasing the amount of current flowing through the reference degeneration MOS transistor device 542, thus decreasing the on-resistance, Ron, of the non-DAC transistor devices 542, 544, 546 and 548, as described above. In this manner, the operating condition circuit 810 is responsive to a decreasing system voltage, Vdd, and allows the operating condition circuit 810 to improve the voltage headroom when the system voltage, Vdd, is decreasing.

When the supply voltage, Vdd, increases, the current flowing through the transistor device 904 increases, reducing the amount of current flowing through the reference degeneration MOS transistor device 542, thus increasing the on-resistance, Ron, of the non-DAC transistor devices 542, 544, 546 and 548, as described above. In this manner, the operating condition circuit 810 is responsive to an increasing system voltage, Vdd, and allows the operating condition circuit 810 to improve the 1/f noise performance when the level of the system voltage, Vdd, allows.

Figure 10:
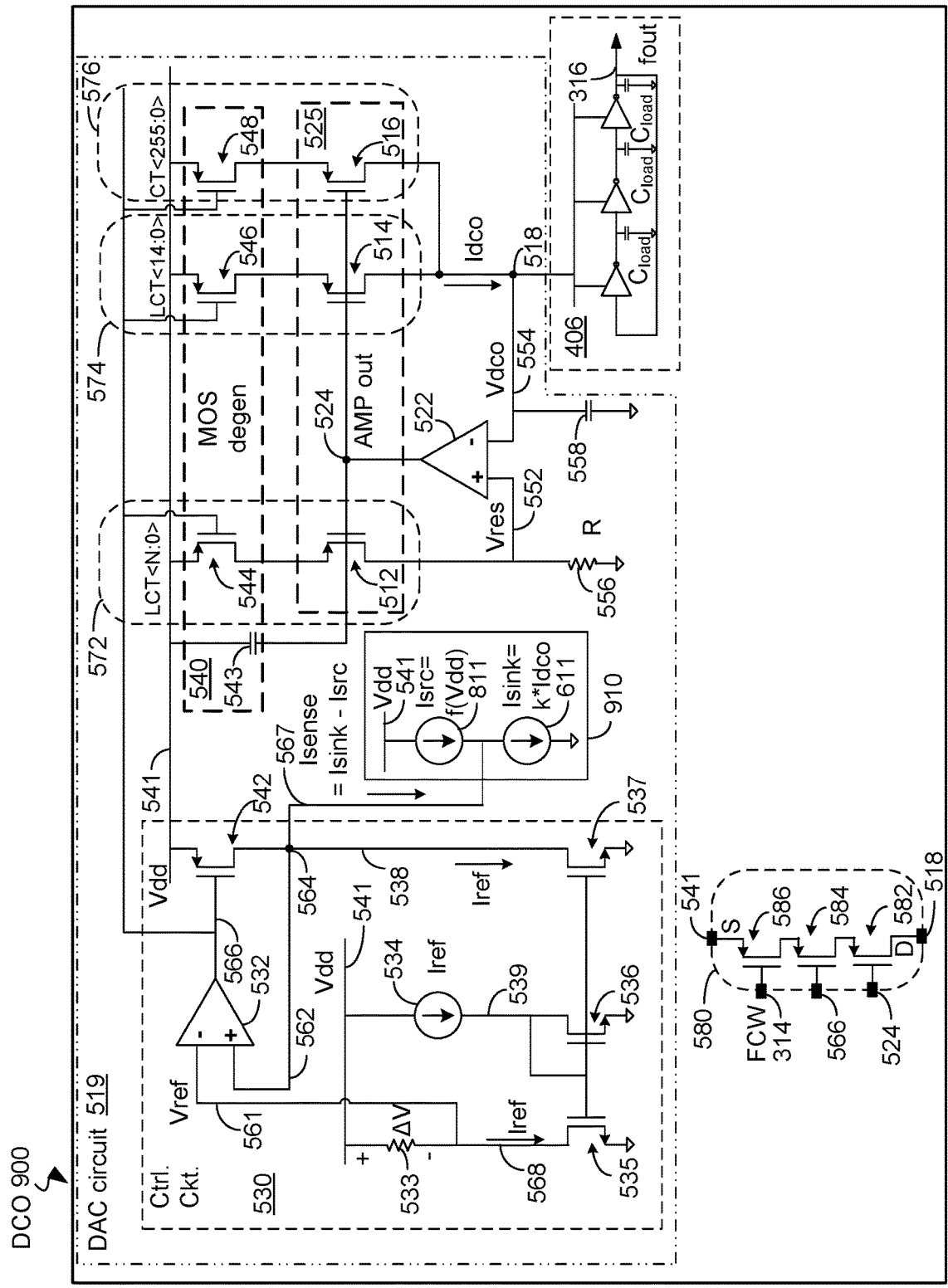
FIG. 10 is a detailed schematic diagram of an exemplary embodiment of a digitally controlled oscillator (DCO), similar to the DCO of FIG. 5, including an exemplary embodiment of an operating condition circuit of FIG. 5.

FIG. 10 is a detailed schematic diagram of an exemplary embodiment of a digitally controlled oscillator (DCO) 900, similar to the DCO of FIG. 5, including an exemplary embodiment of an operating condition circuit of FIG. 5. Elements in FIG. 10 that are identical to corresponding elements in FIG. 5 are numbered identically and are not described again in detail. In the exemplary embodiment of FIG. 10, a DAC circuit 519 comprises the operating condition circuit 910 represented by the current source 611 configured to be responsive to the current, Idco, on connection 518, as described above with respect to FIG. 6; and the current source 811 configured to be responsive to the system voltage, Vdd, on connection 541, as described above with respect to FIG. 8. In this exemplary embodiment, the sense current, Isense, is equal to the sink current, Isink developed by the current source 611 minus the source current, Isrc, developed by the current source 811, such that Isense=Isink-Isrc.

In this manner, both the current, Isink, developed by the current source 611, and the current Isrc, developed by the current source 811, affect the total amount of current flowing through the reference degeneration MOS transistor device 542, thereby controlling the on-resistance, Ron, of the reference degeneration MOS transistor device 542, and the on-resistance, Ron, of the non-DAC transistor devices 544, 546 and 548, responsive to both the current, Idco, and the system voltage, Vdd, as described above.

Figure 11:
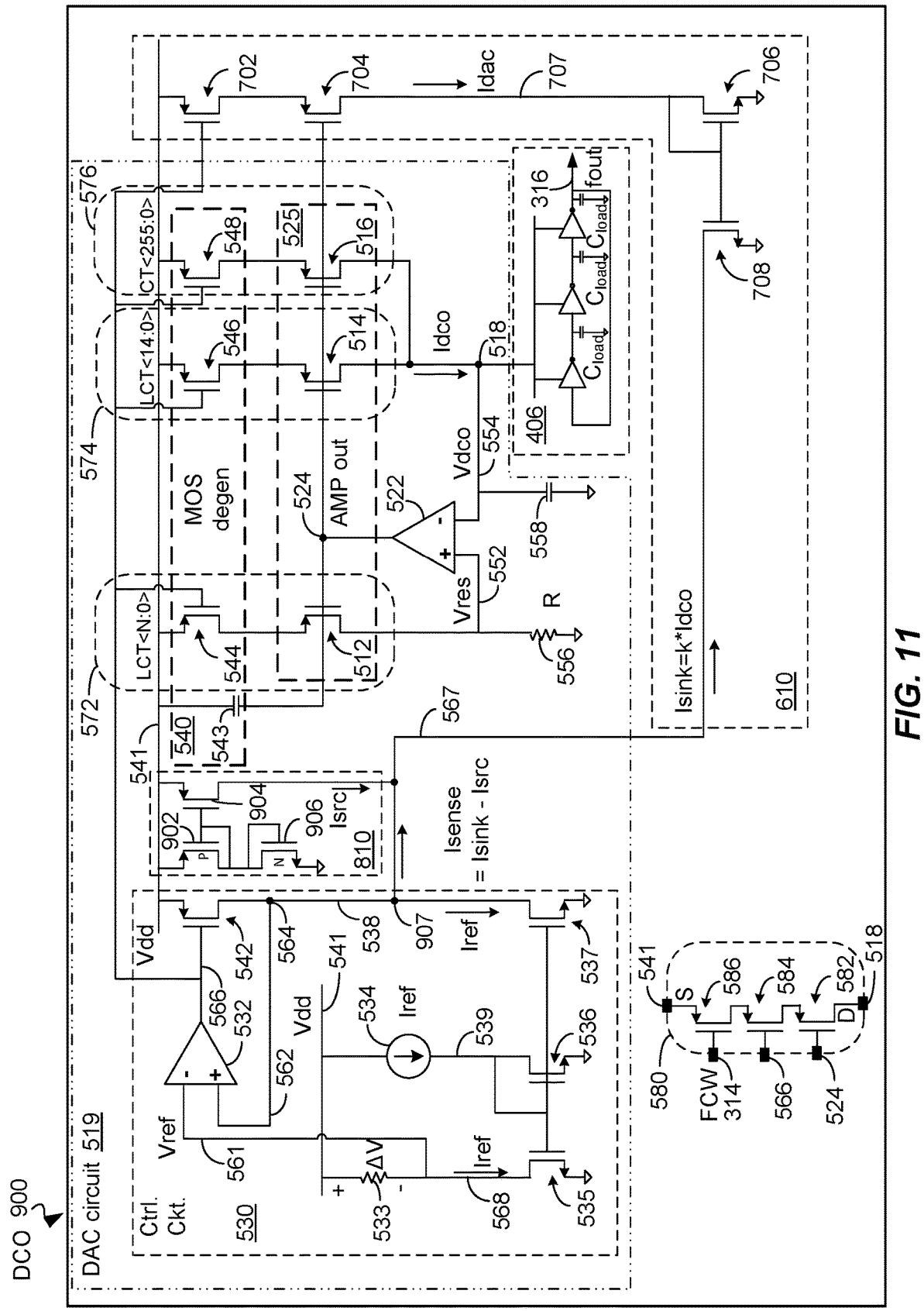
FIG. 11 is a schematic diagram of an exemplary embodiment of a DCO showing an exemplary embodiment of the operating condition circuit of FIG. 9 in greater detail.

FIG. 11 is a schematic diagram of the DCO 900 showing an exemplary embodiment of the operating condition circuit 910 of FIG. 10 in greater detail. In an exemplary embodiment, the operating condition circuit 910 (FIG. 10) comprises the operating condition circuit 610 (FIG. 7) and the operating condition circuit 810 (FIG. 9) implemented together in a DAC circuit 519.

In this exemplary embodiment, the sense current, Isense, is equal to the sink current, Isink developed by the operating condition circuit 610 minus the source current, Isrc, developed by the operating condition circuit 810, such that Isense=Isink-Isrc.

As mentioned herein regarding the operating condition circuit 610, in an exemplary embodiment, at high frequencies, the total current flowing out of the reference degeneration MOS transistor device 542 is increased because the current, Idco, at node 518 is increased at high frequencies. Therefore, the total current flowing out of the reference degeneration MOS transistor device 542 is increased, resulting in lowered degeneration on-resistance, Ron, of the reference degeneration MOS transistor device 542, and consequently, of the non-DAC transistor devices 544, 546 and 548. This reduced degeneration on-resistance, Ron, at high frequencies improves the voltage headroom of the DAC circuit 519 at high frequencies.

Further, as mentioned herein regarding the operating condition circuit 810, in an exemplary embodiment, when the supply voltage, Vdd, decreases, the current flowing through the transistor device 904 decreases, increasing the amount of current flowing through the reference degeneration MOS transistor device 542, thus decreasing the on-resistance, Ron, of the non-DAC transistor devices 542, 544, 546 and 548, as described above. In this manner, the operating condition circuit 810 is responsive to a decreasing system voltage, Vdd, and allows the operating condition circuit 810 to improve the voltage headroom when the system voltage, Vdd, is decreasing.

When the supply voltage, Vdd, increases, the current flowing through the transistor device 904 increases, reducing the amount of current flowing through the reference degeneration MOS transistor device 542, thus increasing the on-resistance, Ron, of the reference degeneration MOS transistor device 542, 544, 546 and 548, as described above. In this manner, the operating condition circuit 810 is responsive to an increasing system voltage, Vdd, and allows the operating condition circuit 810 to improve the 1/f noise performance when the level of the system voltage, Vdd, allows.

In this manner, both the operating condition circuit 610 and the operating condition circuit 810 can be implemented together in the DAC circuit 519 to provide a feedback signal to the control circuit 530 responsive to both the current, Idco, and the system voltage, Vdd, to tune (e.g., optimize) the voltage headroom of the DAC circuit 510 over a wide voltage range and to improve the 1/f noise performance of the DAC circuit 519.

Figure 12:
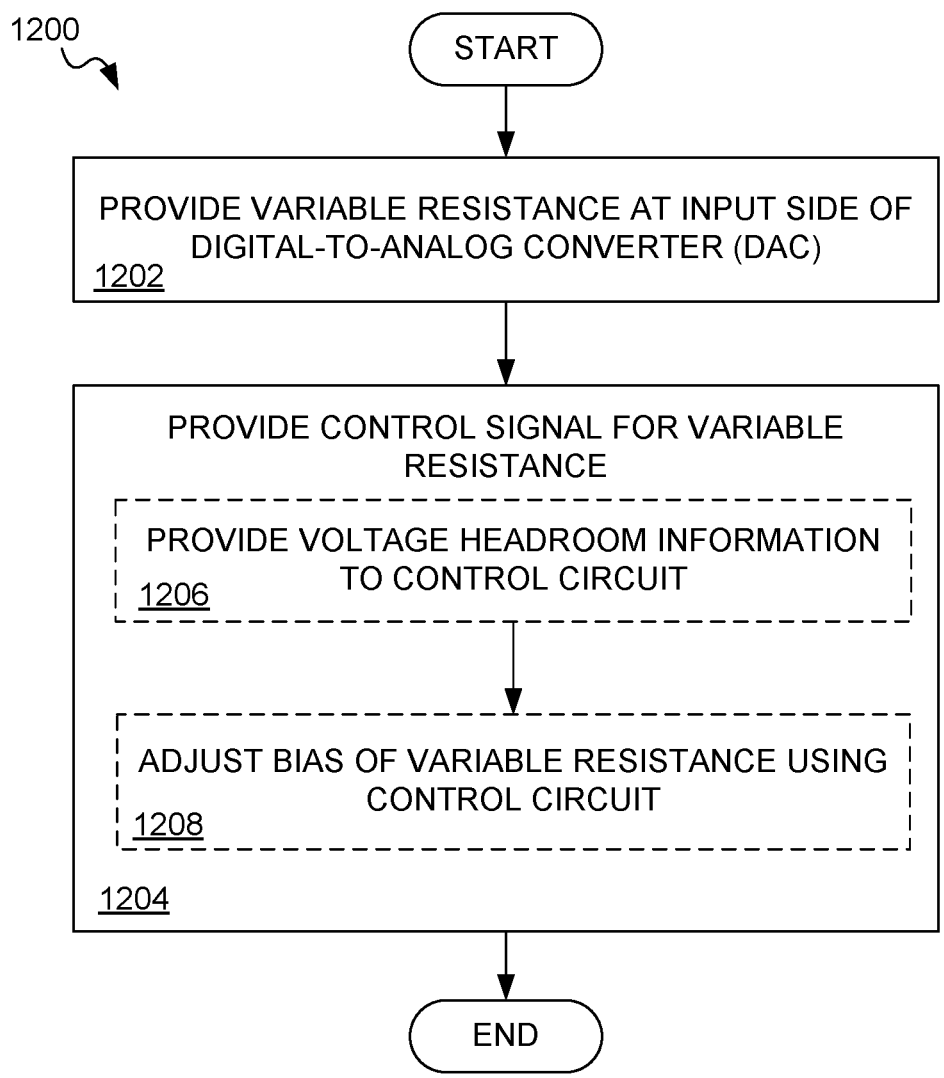
FIG. 12 is a flow chart describing an example of the operation of a DAC circuit in accordance with an exemplary embodiment of the disclosure.

FIG. 12 is a flow chart 1200 describing an example of the operation of a DAC circuit. The blocks in the method 1200 can be performed in or out of the order shown, and in some embodiments, can be performed at least in part in parallel.

In block 1202, a variable resistance is provided at an input side of a DAC. The variable resistance may be provided by, for example, the non-DAC transistor devices 544, 546 and 548 of FIGS. 5 through 11 coupled to respective DAC transistor devices 512, 514 and 516. In an exemplary embodiment, the non-DAC transistor devices 544, 546 and 548 comprise respective degenerative resistances for the DAC transistor devices 512, 514 and 516.

In block 1204, a control signal for the variable resistance is provided. The control signal may be provided, for example, by the control circuit 530 of FIGS. 5 through 11.

In some embodiments, providing the control signal in block 1204 comprises providing voltage headroom information to the control circuit 530 based on one or more of a current output of the DAC and a system voltage of the DAC, as illustrated in block 1206. For example, the operating condition circuit (e.g., 570, 610, 810, 910) of FIGS. 5 through 11 may be configured to provide voltage headroom information to the control circuit 530 based on one or more of a current output of the DAC and a system voltage of the DAC.

In some embodiments, providing the control signal in block 1204 may further comprise adjusting a bias of the variable resistance by the control circuit 530, as illustrated in block 1208. For example, a bias of a reference degeneration MOS transistor device 542 may be adjusted by the control circuit of FIGS. 5 through 11 to adjust the resistance of the non-DAC transistor devices 542, 544, 546 and 548.

Figure 13:
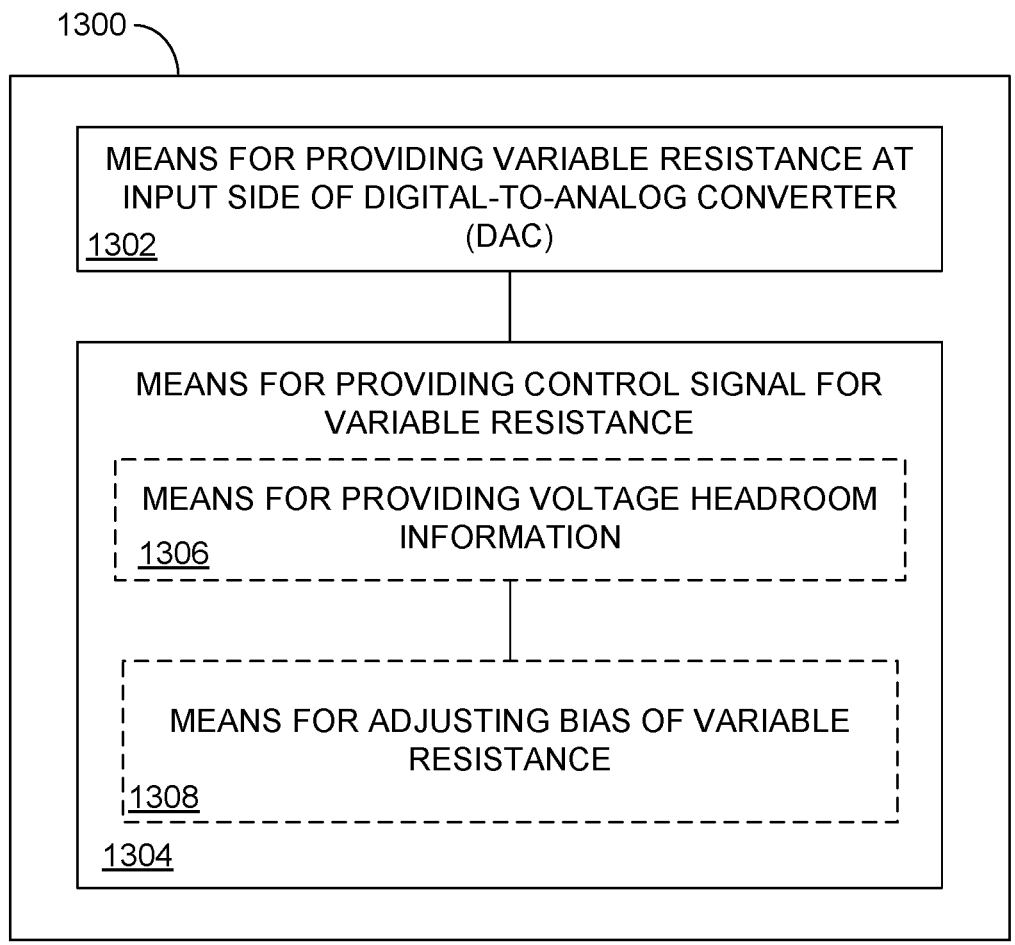
FIG. 13 is a functional block diagram of an apparatus for a DAC circuit in accordance with an exemplary embodiment of the disclosure.

FIG. 13 is a functional block diagram of an apparatus for a DAC circuit in accordance with an exemplary embodiment. The apparatus 1300 comprises means 1302 for providing a variable resistance at an input side of a DAC. In certain embodiments, the means 1302 for providing a variable resistance at an input side of a DAC can be configured to perform one or more of the functions described in operation block 1202 of method 1200 (FIG. 12). In an exemplary embodiment, the means 1202 for providing a variable resistance at an input side of a DAC may comprise the non-DAC transistor devices 544, 546 and 548 of FIGS. 5 through 11, for example as coupled to respective DAC transistor devices 512, 514 and 516.

The apparatus 1300 also comprises means 1304 for providing a control signal for the variable resistance. The means 1304 for providing a control signal for the variable resistance can be configured to perform one or more of the functions described in operation block 1204 of method 1200 (FIG. 12). In an exemplary embodiment, the means 1304 for providing a control signal may comprise the control circuit 530 of FIGS. 5 to 11.

In some embodiments, the means for providing a control signal for the variable resistance may comprise means 1306 for providing voltage headroom information. In certain embodiments, the means 1306 for providing voltage headroom information can be configured to perform one or more of the functions described in operation block 1206 of method 1200 (FIG. 12). In an exemplary embodiment, the means 1306 for providing voltage headroom information may comprise the operating condition circuit of FIGS. 5 through 11 providing voltage headroom information to the control circuit 530 based on one or more of a current output of the DAC and a system voltage of the DAC.

In some embodiments, the means for providing a control signal for the variable resistance may further comprise means 1308 for adjusting a bias of the variable resistance. In certain embodiments, the means 1308 for adjusting a bias of the variable resistance can be configured to perform one or more of the functions described in operation block 1208 of method 1200 (FIG. 12). In an exemplary embodiment, the means 1308 for adjusting a bias of the variable resistance may comprise the control circuit of FIGS. 5 through 11 adjusting the resistance of the reference degeneration MOS transistor device 542, and the non-DAC transistor devices 544, 546 and 548 based on the voltage headroom information provided by the means 1306.

The circuit architecture described herein described herein may be implemented on one or more ICs, analog ICs, RFICs, mixed-signal ICs, ASICs, printed circuit boards (PCBs), electronic devices, etc. The circuit architecture described herein may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Although selected aspects have been illustrated and described in detail, it will be understood that various substitutions and alterations may be made therein without departing from the spirit and scope of the present invention, as defined by the following claims.

What is claimed is:

1. A digital to analog converter (DAC), comprising:
    a plurality of DAC transistor devices having an input side configured to be selectively coupled to a system voltage based on a digital input signal and an output side configured to provide an analog output signal;
    a plurality of non-DAC transistor devices coupled to the input side of the DAC transistor devices, the non-DAC transistor devices configured as variable resistances; and
    a control circuit configured to adjust a bias of the non-DAC transistor devices.

2. The DAC of claim 1, wherein the control circuit comprises a resistance, a current source, and a reference non-DAC transistor device coupled to the non-DAC transistor devices, the reference non-DAC transistor device coupled to a bias operational amplifier (OpAmp) responsive to a reference voltage and a voltage at a drain of the reference non-DAC transistor device.

3. The DAC of claim 1, wherein the plurality of non-DAC transistor devices are biased in a triode region.

4. The DAC of claim 1, wherein the control circuit is configured to adjust the resistance of the plurality of non-DAC transistor devices.

5. The DAC of claim 1, further comprising an operating condition circuit coupled to the control circuit, the operating condition circuit having a current source that generates a sense current that is proportional to a current output (Idco) of the DAC, the sense current provided to the control circuit to allow the control circuit to adjust a resistance of at least one of the non-DAC transistor devices based on the current output (Idco) of the DAC.

6. The DAC of claim 5, wherein the current source comprises a plurality of transistor devices configured to generate a scaled current output (k*Idco) of the DAC.

7. The DAC of claim 1, further comprising an operating condition circuit coupled to the control circuit, the operating condition circuit having a current source that generates a sense current that is proportional to an input voltage level of the DAC, the sense current provided to the control circuit to allow the control circuit to adjust a resistance of at least one of the non-DAC transistor devices based on the input voltage level of the DAC.

8. The DAC of claim 7, wherein the current source comprises a plurality of transistor devices configured to generate a current that varies with the input voltage level of the DAC.

9. The DAC of claim 1, further comprising an operating condition circuit coupled to the control circuit, the operating condition circuit having a plurality of current sources that generate a sense current that is proportional to a current output (Idco) of the DAC and proportional to an input voltage level of the DAC, the sense current provided to the control circuit to allow the control circuit to adjust a resistance of at least one of the non-DAC transistor devices based on one or more of the current output (Idco) of the DAC and an input voltage level of the DAC.

10. A method for operating a digital-to-analog converter (DAC), comprising:
    providing a variable resistance at an input side of a digital to analog converter (DAC);
    biasing the variable resistance in a triode region;
    providing a signal indicative of a voltage headroom to a control circuit; and
    adjusting the variable resistance using the control circuit.

11. The method of claim 10, further comprising providing a feedback signal to the control circuit, the feedback signal comprising a sense current that is proportional to a current output (Idco) of the DAC, the sense current provided to the control circuit to allow the control circuit to adjust the variable resistance based on the current output (Idco) of the DAC.

12. The method of claim 11, wherein the sense current comprises a scaled current output (k*Idco) of the DAC.

13. The method of claim 10, further comprising providing a feedback signal to the control circuit, the feedback signal comprising a sense current that is proportional to an input voltage level of the DAC, the sense current provided to the control circuit to allow the control circuit to adjust the variable resistance based on the input voltage level of the DAC.

14. The method of claim 13, wherein the sense current comprises a current related to the input voltage level of the DAC.

15. The method of claim 10, further comprising providing a feedback signal to the control circuit, the feedback signal comprising a sense current that is proportional to a current output (Idco) of the DAC and proportional to an input voltage level of the DAC, the sense current provided to the control circuit to allow the control circuit to adjust the variable resistance based on one or more of the current output (Idco) of the DAC and an input voltage level of the DAC.

16. A device, comprising:
    means for providing a variable resistance at an input side of a digital to analog converter (DAC);
    means for biasing the variable resistance in a triode region;

means for providing a signal indicative of a voltage headroom; and means for adjusting the variable resistance based on the signal indicative of the voltage headroom.

17. The device of claim 16, further comprising:

means for providing a feedback signal to the means for adjusting, the feedback signal comprising a sense current that is proportional to a current output (Idco) of the DAC, the sense current provided to the means for adjusting to allow the means for adjusting to adjust the variable resistance based on the current output (Idco) of the DAC.

18. The device of claim 16, further comprising:

means for providing a feedback signal to the means for adjusting, the feedback signal comprising a sense current that is proportional to an input voltage level of the DAC, the sense current provided to the means for adjusting to allow the means for adjusting to adjust the variable resistance based on the input voltage level of the DAC.

19. The device of claim 16, further comprising:

means for providing a feedback signal to the means for adjusting, the feedback signal comprising a sense current that is proportional to a current output (Idco) of the DAC and proportional to an input voltage level of the DAC, the sense current provided to the means for adjusting to allow the means for adjusting to adjust the variable resistance based on one or more of the current output (Idco) of the DAC and an input voltage level of the DAC.

20. A phase locked loop (PLL) circuit, comprising:

a phase detector configured to provide a control signal;

a filter configured to receive the control signal and provide a frequency code word;

a digitally controlled oscillator (DCO) configured to receive the frequency code word, the DCO having a digital-to-analog converter (DAC) circuit, and a ring oscillator, the DAC circuit comprising:

a plurality of DAC transistor devices having an input side coupled to an output of the filter and an output side coupled to the ring oscillator; and a plurality of non-DAC transistor devices coupled to the input side of the DAC transistor devices, the non-DAC transistor devices configured as variable resistances.

21. The PLL circuit of claim 20, further comprising a control circuit configured to adjust a bias of the non-DAC transistor devices, wherein the control circuit comprises a resistance, a current source, and a reference non-DAC transistor device coupled to the non-DAC transistor devices, the reference non-DAC transistor device coupled to a bias operational amplifier (OpAmp) responsive to a reference voltage and a voltage at a drain of the reference non-DAC transistor device.

22. The PLL circuit of claim 21, wherein the plurality of non-DAC transistor devices are biased in a triode region.

23. The PLL circuit of claim 21, wherein the control circuit is configured to adjust a resistance of the plurality of non-DAC transistor devices.

24. The PLL circuit of claim 21, further comprising an operating condition circuit coupled to the control circuit, the operating condition circuit having a current source that generates a sense current that is proportional to a current output (Idco) of the DAC, the sense current provided to the control circuit to allow the control circuit to adjust a resistance of at least one of the non-DAC transistor devices based on the current output (Idco) of the DAC.

25. The PLL circuit of claim 24, wherein the current source comprises a plurality of transistor devices configured to generate a scaled current output (k*Idco) of the DAC.

26. The PLL circuit of claim 21, further comprising an operating condition circuit coupled to the control circuit, the operating condition circuit having a current source that generates a sense current that is proportional to an input voltage level of the DAC, the sense current provided to the control circuit to allow the control circuit to adjust a resistance of at least one of the non-DAC transistor devices based on the input voltage level of the DAC.

27. The PLL circuit of claim 26, wherein the current source comprises a plurality of transistor devices configured to generate a current related to the input voltage level of the DAC.

28. The PLL circuit of claim 21, further comprising an operating condition circuit coupled to the control circuit, the operating condition circuit having a plurality of current sources that generate a sense current that is proportional to a current output (Idco) of the DAC and proportional to an input voltage level of the DAC, the sense current provided to the control circuit to allow the control circuit to adjust a resistance of at least one of the non-DAC transistor devices based on one or more of the current output (Idco) of the DAC and an input voltage level of the DAC.

* * * * *